United States Patent
Tokuda

(10) Patent No.: US 7,954,076 B2
(45) Date of Patent: May 31, 2011

(54) TRANSMISSION DELAY ANALYZING APPARATUS, MEDIUM RECORDING TRANSMISSION DELAY ANALYZING PROGRAM, AND TRANSMISSION DELAY ANALYZING METHOD

(75) Inventor: Kazuhiko Tokuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 330 days.

(21) Appl. No.: 12/331,120

(22) Filed: Dec. 9, 2008

(65) Prior Publication Data

US 2009/0298438 A1   Dec. 3, 2009

(30) Foreign Application Priority Data

May 27, 2008   (JP) .................. 2008-138313

(51) Int. Cl.
*G06F 9/455* (2006.01)
(52) U.S. Cl. .................. 716/108; 716/113; 716/115
(58) Field of Classification Search .............. 716/6, 105, 716/115, 106, 108, 113; 455/67.11
See application file for complete search history.

(56) References Cited

U.S. PATENT DOCUMENTS

| | | | |
|---|---|---|---|
| 4,207,523 A | 6/1980 | Acker | |
| 6,173,427 B1 | 1/2001 | Tsukagoshi | |
| 6,246,717 B1 | 6/2001 | Chen et al. | |
| 6,915,249 B1 * | 7/2005 | Sato et al. | 703/14 |
| 7,272,807 B2 * | 9/2007 | Ding et al. | 716/113 |
| 2004/0042715 A1 | 3/2004 | Linden et al. | |
| 2006/0164066 A1 * | 7/2006 | Shioiri et al. | 324/76.22 |

FOREIGN PATENT DOCUMENTS

| | | |
|---|---|---|
| JP | 61-005618 A | 1/1986 |
| JP | 7-264041 A | 10/1995 |
| JP | 2006-244325 A | 9/2006 |
| JP | 2007-503789 A | 2/2007 |
| WO | 2004/107190 A1 | 12/2004 |

OTHER PUBLICATIONS

Japanese Office Action dated Jun. 16, 2010, issued in corresponding Japanese Patent Application No. 10-2008-0128565.
Korean Office Action dated Jun. 16, 2010, issued in corresponding Korean Patent Application No. 10-2008-0128565.
European Search Report dated Sep. 23, 2009, issued in corresponding European Patent Application No. 08171375.

* cited by examiner

*Primary Examiner* — Paul Dinh
*Assistant Examiner* — Brian Ngo
(74) *Attorney, Agent, or Firm* — Westerman, Hattori, Daniels & Adrian, LLP

(57) ABSTRACT

A transmission delay analyzing apparatus includes: a first acquisition section that acquires a noise waveform from among waveforms which propagate in a first transmission line and acquired by a receiving circuit; a first calculation section that calculates a noise peak level which is the peak level of the noise waveform acquired by the first acquisition section; a second acquisition section that acquires a signal waveform free from noise from among the waveforms which propagate in the first transmission line and acquired by the receiving circuit; and a second calculation section that calculates a delay variation of a transmitted signal based on the signal waveform acquired by the second acquisition section, a threshold for determining the level of a signal that the receiving circuit has received from the first transmission line, and the noise peak level calculated by the first calculation section.

20 Claims, 25 Drawing Sheets

FIG. 28

$$VIHr = VIH + \sqrt{\frac{Vnr1^2 + Vnr3^2}{2}}$$

$$VIHf = VIH - \sqrt{\frac{Vnf1^2 + Vnf3^2}{2}}$$

FIG. 29

$$VILr = VIL + \sqrt{\frac{Vnr1^2 + Vnr3^2}{2}}$$

$$VILf = VIL - \sqrt{\frac{Vnf1^2 + Vnf3^2}{2}}$$

FIG. 35

$$VIHr = VIH + \sqrt{\frac{Vnr^2 + Vnsr^2}{2}}$$

$$VIHf = VIH - \sqrt{\frac{Vnf^2 + Vnsf^2}{2}}$$

FIG. 36

$$VILr = VIL + \sqrt{\frac{Vnr^2 + Vnsr^2}{2}}$$

$$VILf = VIL - \sqrt{\frac{Vnf^2 + Vnsf^2}{2}}$$

TRANSMISSION DELAY ANALYZING APPARATUS, MEDIUM RECORDING TRANSMISSION DELAY ANALYZING PROGRAM, AND TRANSMISSION DELAY ANALYZING METHOD

BACKGROUND

1. Field

The present invention relates to a transmission delay analyzing apparatus, a medium recording a transmission delay analyzing program, and a transmission delay analyzing method that analyze a variation in transmission delay caused by noise.

2. Description of the Related Art

There is known an analysis technique that uses a simulator for checking whether a signal is normally transmitted in a device that exchanges information in high-speed signal transmission. Whether such an information communication device is operating normally or not is determined using a timing calculation of a signal transmitted between an LSI (Large Scale Integration). Since the timing calculation is performed with a delay variation taken into consideration, simulation needs to be used to calculate this value.

A transmission waveform changes under the influence of crosstalk noise generated by crosstalk between transmission lines. The delay variation is defined as the maximum and minimum values of the difference between a transmission delay at the time of absence of influence of crosstalk and transmission delay at the time of presence of influence of crosstalk.

The reason for using the maximum and minimum values is that the difference between a transmission line delay at the time of absence of influence of crosstalk and transmission line delay at the time of presence of influence of crosstalk changes depending on the timing at which crosstalk exerts an influence on the transmission line. Here, the maximum value indicates the largest value of the transmission line delay, and the minimum value indicates the smallest value thereof.

An example of a conventional delay variation calculation method which uses a waveform synthesis technique will be described.

A procedure of calculating the delay variation is as follows.

(S1) A simulator generates a transmission waveform free from crosstalk noise and measures a transmission line delay with respect to the transmission waveform with a voltage VIH or VIL set as a threshold.

(S2) The simulator generates a crosstalk noise waveform.

(S3) The simulator generates another transmission waveform by superimposing, at a predetermined timing, the crosstalk noise waveform on the crosstalk-noise-free transmission waveform and measures the transmission line delay with respect to the transmission waveform with a voltage VIH or VIL set as a threshold.

(S4) The simulator changes the timing at which the crosstalk noise waveform is superimposed on the crosstalk-noise-free transmission waveform and executes once again the processing of S3 for measuring transmission line delay data.

(S5) The simulator calculates a difference between the transmission line delay measured in S1 and that measured in S3 and a difference between the transmission line delay measured in S1 and that measured in S4 and sets the maximum value and minimum value of the calculated differences as the delay variation.

As a prior art relating to the present invention, there is known an input buffer circuit capable of outputting a stable signal even if noise is included in an input signal (refer to, e.g., Patent Document 1: Jpn. Pat. Appln. Laid-Open Publication No. 7-264041)

However, in the conventional delay variation calculation method, it is necessary to generate a plurality of transmission waveforms by superimposing the crosstalk noise waveform on the crosstalk-noise-free transmission waveform and to measure the transmission line delay for each generated transmission waveform. Therefore, it takes time to calculate the delay variation.

SUMMARY

According to an aspect of the invention, an apparatus includes transmission delay analyzing apparatus that analyzes a delay of a signal which is transmitted from a transmitting circuit to a receiving circuit via a predetermined first transmission line included in a plurality of transmission lines connecting the transmitting and receiving circuits, comprising: a first acquisition section that acquires a noise waveform from among waveforms which propagate in the first transmission line and acquired by the receiving circuit; a first calculation section that calculates a noise peak level which is the peak level of the noise waveform acquired by the first acquisition section; a second acquisition section that acquires a signal waveform free from noise from among the waveforms which propagate in the first transmission line and acquired by the receiving circuit; and a second calculation section that calculates a delay variation of the transmitted signal based on the signal waveform acquired by the second acquisition section, a threshold for determining the level of a signal that the receiving circuit has received from the first transmission line, and the noise peak level calculated by the first calculation section.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 28 is formulas showing an example of thresholds VIHr and VIHf according to the third embodiment;

FIG. 29 is formulas showing an example of thresholds VILr and VILf according to the third embodiment;

FIG. 35 is formulas showing an example of thresholds VIHr and VIHf according to the fifth embodiment; and FIG. 36 is formulas showing an example of thresholds VILr and VILf according to the fifth embodiment.

DETAILED DESCRIPTION OF THE PREFERRED EMBODIMENTS

Embodiments of the present invention will be described below with reference to the accompanying drawings.

First Embodiment

A first analysis target circuit which is a circuit to be analyzed by a transmission delay analyzing apparatus according to a first embodiment will be described below.

Figure 1:
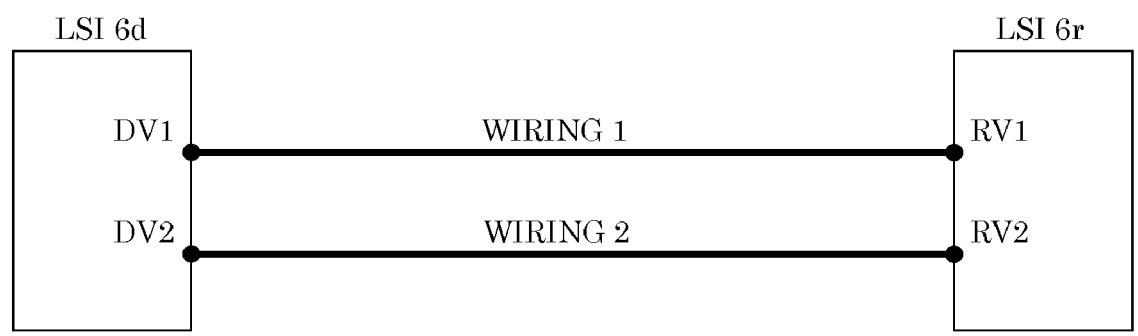
FIG. 1 is a circuit diagram showing an example of a configuration of a first analysis target circuit.

The first analysis target circuit is a circuit having one wiring that induces crosstalk noise. FIG. 1 is a circuit diagram showing an example of a configuration of the first analysis target circuit. As shown in FIG. 1, the first analysis target circuit has an LSI $6d$ (transmitting circuit) and an LSI $6r$ (receiving circuit). Wirings (transmission lines) 1 and 2 each connect the LSI $6d$ and LSI $6r$ for transmitting a signal from the LSI $6d$ to LSI $6r$. A transmission voltage applied to the wiring 1 (second transmission line) in the LSI $6d$ is defined as DV1, and transmission voltage applied to the wiring 2 (first transmission line) in the LSI $6d$ is defined as DV2. A reception voltage output from the wiring 1 in the LSI $6r$ is defined as RV1, and reception voltage output from the wiring 2 in the LSI $6r$ is defined as RV2.

When the reception voltage becomes not less than a threshold voltage VIH (Input logic High), the LSI $6r$ determines the logic state as "H" (High) and when the reception voltage becomes not more than a threshold voltage VIL (Input logic Low), the LSI $6r$ determines the logic state as "L" (Low). A transmission line (wiring 1 or wiring 2) delay time between the LSI $6d$ and LSI $6r$ in the case of absence of crosstalk noise is defined as tdelay. Further, the rising gradient and falling gradient of the DV1 waveform and DV2 waveform are assumed to be uniform.

Some cases of crosstalk noise occurring in the first analysis target circuit will be described.

Crosstalk noise of case C11 will be described below.

Figure 2:
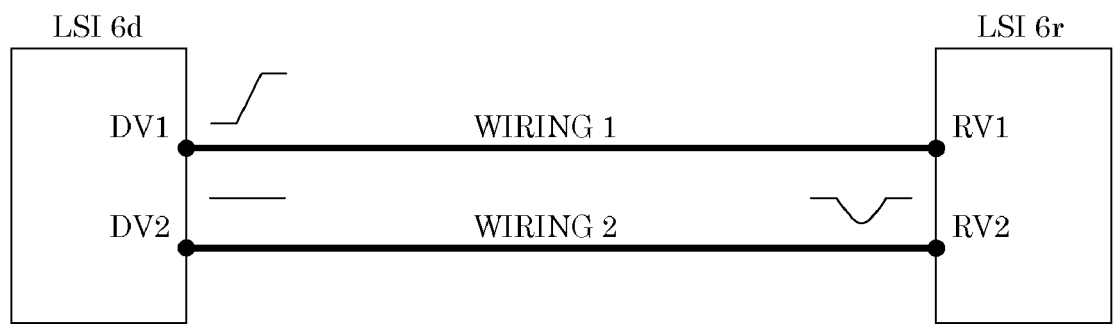
FIG. 2 is a conceptual view showing an example of crosstalk noise of case C11.
Figure 3:
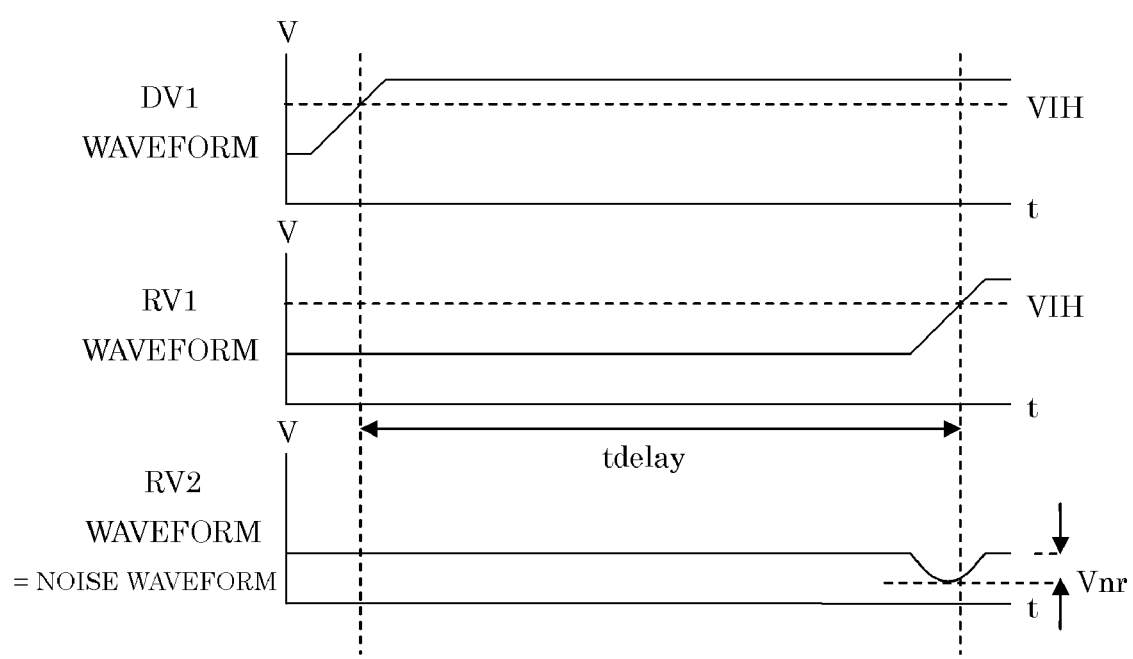
FIG. 3 is a timing chart showing an example of crosstalk noise of case C11.

The case C11 is a case where DV1 waveform is a rising edge and crosstalk noise occurs in RV2. FIG. 2 is a conceptual view showing an example of crosstalk noise of case C11. FIG. 2 roughly illustrates the waveforms of DV1, DV2, and RV2. FIG. 3 is a timing chart showing an example of crosstalk noise of case C11. FIG. 3 illustrates, from the top, (a) DV1 waveform, (b) DV2 waveform, and (c) RV2 waveform (noise waveform). When the interval between the wirings 1 and 2 is small, the level of RV2 changes at the same time when the level of DV1 changes. This change in RV2 is crosstalk noise. The maximum amplitude of a crosstalk noise voltage (RV2) is assumed to be Vnr.

Crosstalk noise of case C12 will be described below.

Figure 4:
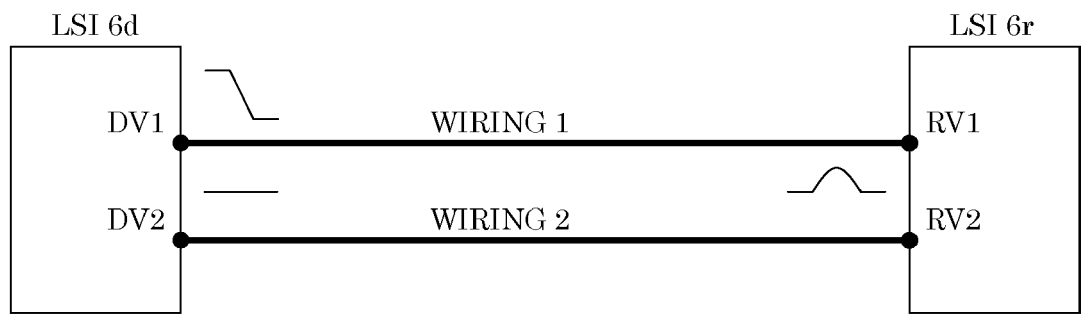
FIG. 4 is a conceptual view showing an example of crosstalk noise of case C12.
Figure 5:
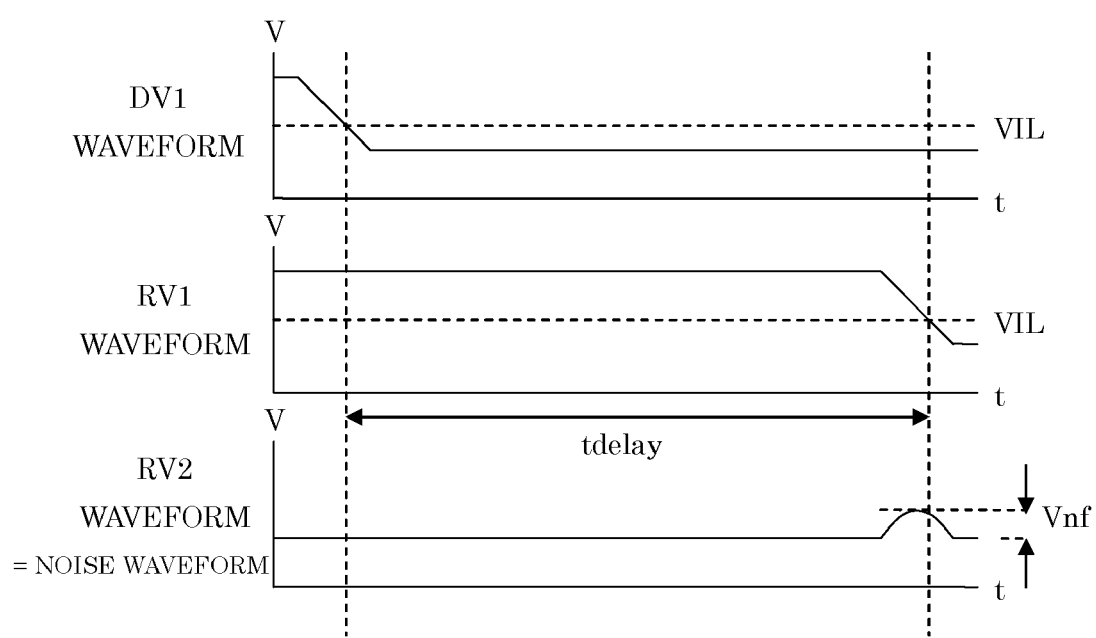
FIG. 5 is a timing chart showing an example of crosstalk noise of case C12.

The case C12 is a case where DV1 waveform is a falling edge and crosstalk noise occurs in RV2. FIG. 4 is a conceptual view showing an example of crosstalk noise of case C12. FIG. 4 roughly illustrates the waveforms of DV1, DV2, and RV2. FIG. 5 is a timing chart showing an example of crosstalk noise of case C12. FIG. 5 illustrates, from the top, (a) DV1 waveform, (b) DV2 waveform, and (c) RV2 waveform (noise waveform). When the interval between the wirings 1 and 2 is small, the level of RV2 changes at the same time when the level of DV1 changes. This change in RV2 is crosstalk noise. The maximum amplitude of a crosstalk noise voltage (RV2) is assumed to be Vnf.

Some cases of a delay variation in the first analysis target circuit will be described.

A delay variation of case D11 will be described below.

Figure 6:
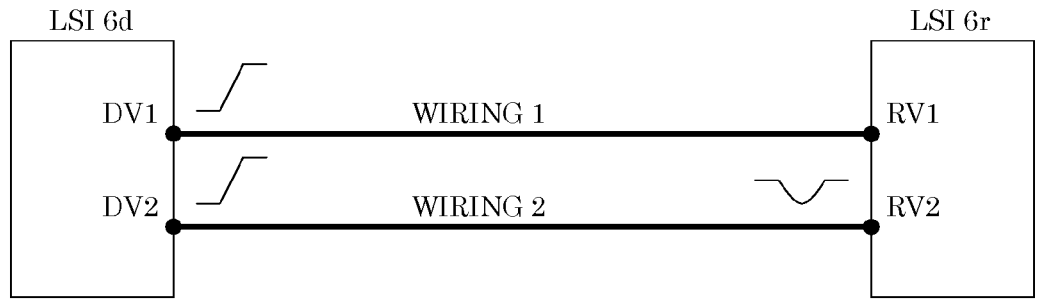
FIG. 6 is a conceptual view showing an example of a delay variation of case D11.
Figure 7:
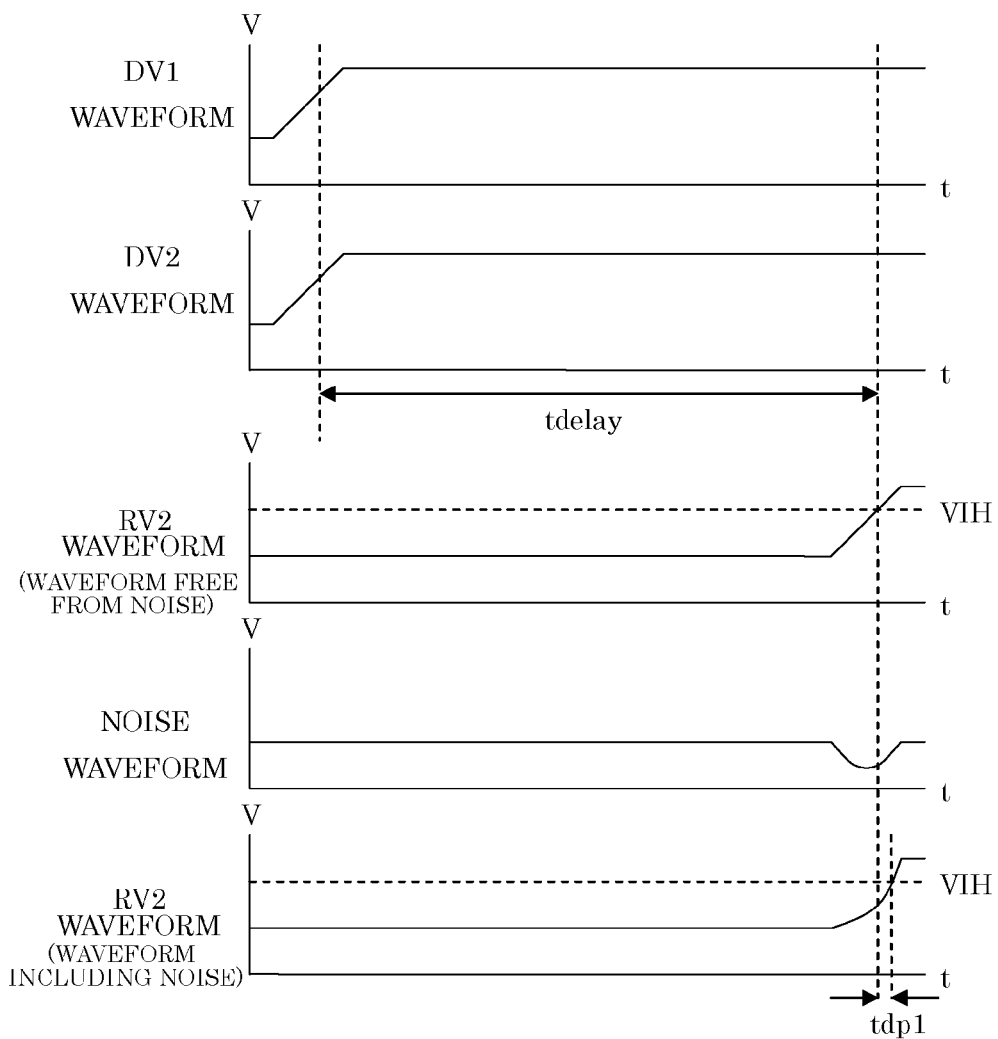
FIG. 7 is a timing chart showing an example of a delay variation of case D11.

Case D11 shows a delay variation in the case where both DV1 and DV2 waveforms are rising edges. FIG. 6 is a conceptual view showing an example of a delay variation of case D11. FIG. 6 roughly illustrates the waveforms of DV1, DV2, and RV2. FIG. 7 is a timing chart showing an example of a delay variation of case D11. FIG. 7 illustrates, from the top, (a) DV1 waveform, (b) DV2 waveform, (c) RV2 waveform free from noise, (d) noise waveform, and (e) RV2 waveform including noise. As illustrated, a delay of RV2 with respect to DV2 is increased by a delay variation tpd1 due to occurrence of crosstalk noise.

A delay variation of case D12 will be described below.

Figure 8:
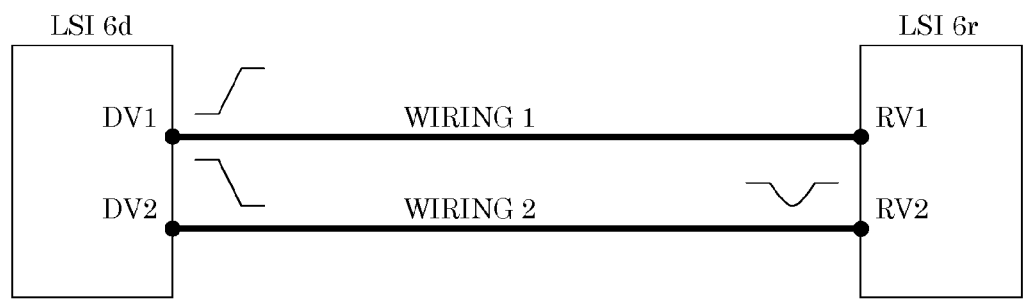
FIG. 8 is a conceptual view showing an example of a delay variation of case D12.
Figure 9:
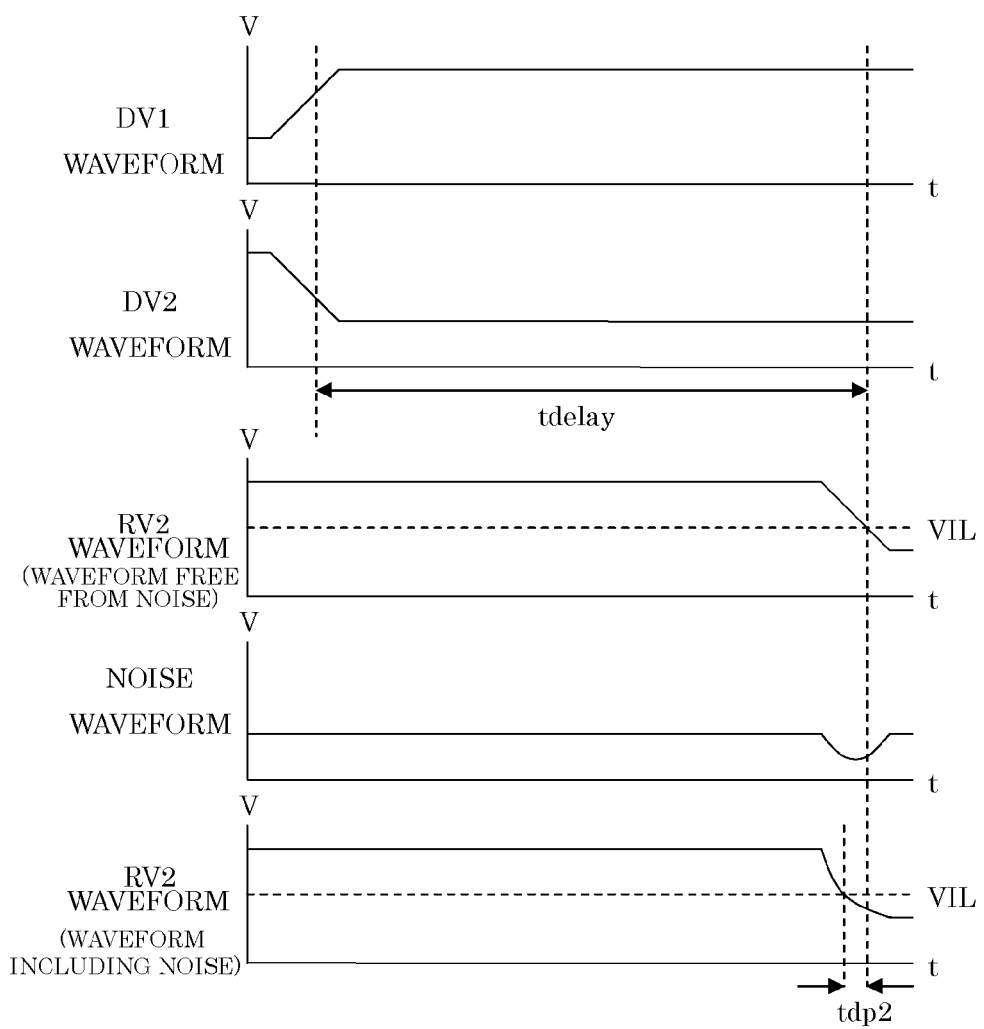
FIG. 9 is a timing chart showing an example of a delay variation of case D12.

Case D12 shows a delay variation in the case where DV1 waveform is a rising edge and DV2 waveform is a falling edge. FIG. 8 is a conceptual view showing an example of a delay variation of case Dl2. FIG. 8 roughly illustrates the waveforms of DV1, DV2, and RV2. FIG. 9 is a timing chart showing an example of a delay variation of case D12. FIG. 9 illustrates, from the top, (a) DV1 waveform, (b) DV2 waveform, (c) RV2 waveform free from noise, (d) noise waveform, and (e) RV2 waveform including noise. As illustrated, a delay of RV2 with respect to DV2 is decreased by a delay variation tpd2 due to occurrence of crosstalk noise.

A delay variation of case D13 will be described below.

Figure 10:
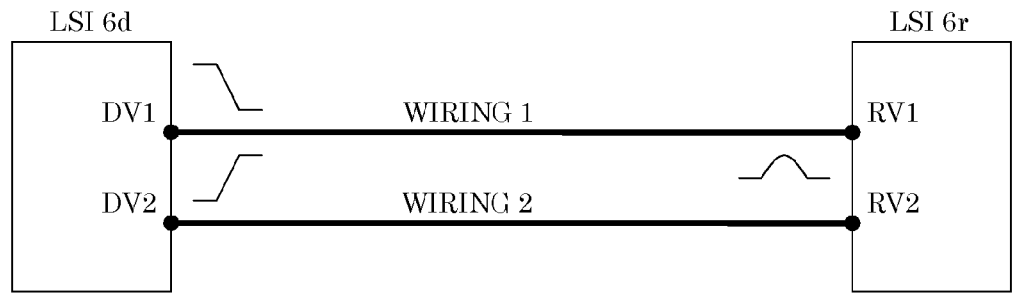
FIG. 10 is a conceptual view showing an example of a delay variation of case D13.
Figure 11:
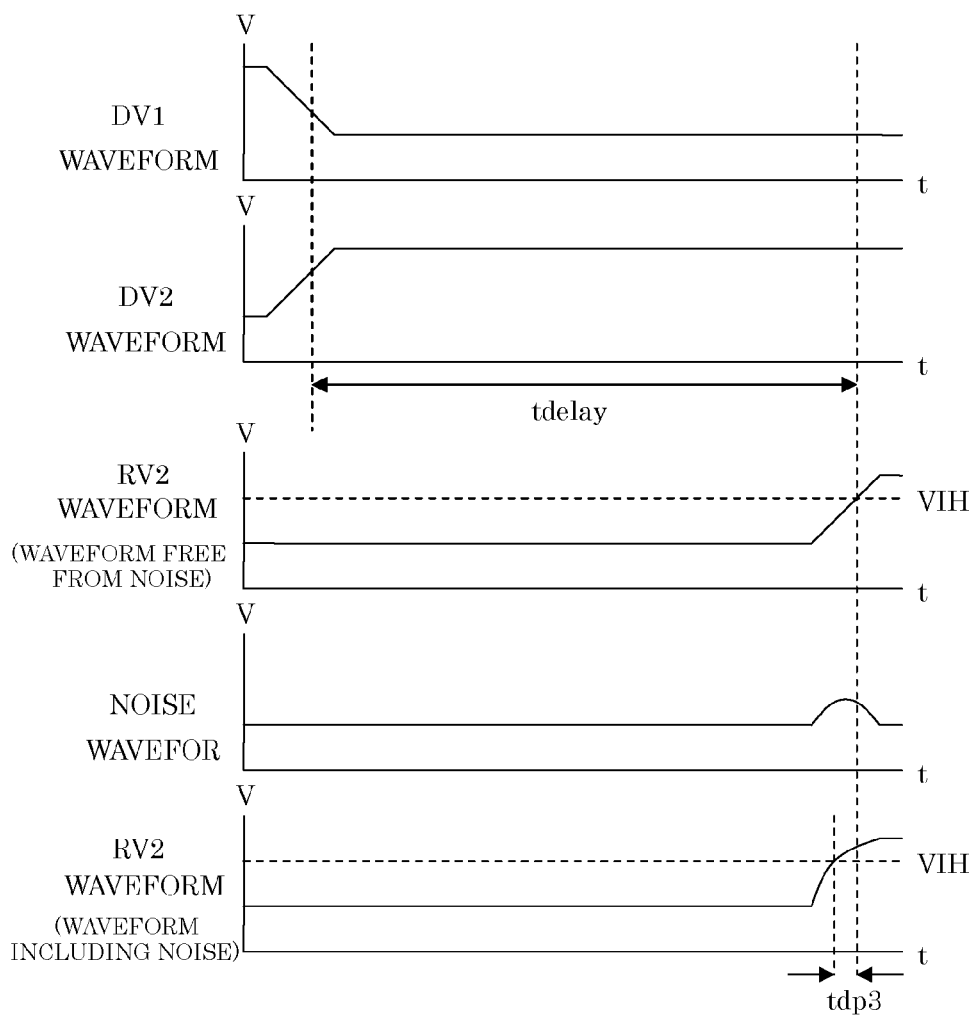
FIG. 11 is a timing chart showing an example of a delay variation of case D13.

Case D13 shows a delay variation in the case where DV1 waveform is a falling edge and DV2 waveform is a rising edge. FIG. 10 is a conceptual view showing an example of a delay variation of case D13. FIG. 10 roughly illustrates the waveforms of DV1, DV2, and RV2. FIG. 11 is a timing chart showing an example of a delay variation of case D13. FIG. 11 illustrates, from the top, (a) DV1 waveform, (b) DV2 waveform, (c) RV2 waveform free from noise, (d) noise waveform, and (e) RV2 waveform including noise. As illustrated, a delay of RV2 with respect to DV2 is decreased by a delay variation tpd3 due to occurrence of crosstalk noise.

A delay variation of case D14 will be described below.

Figure 12:
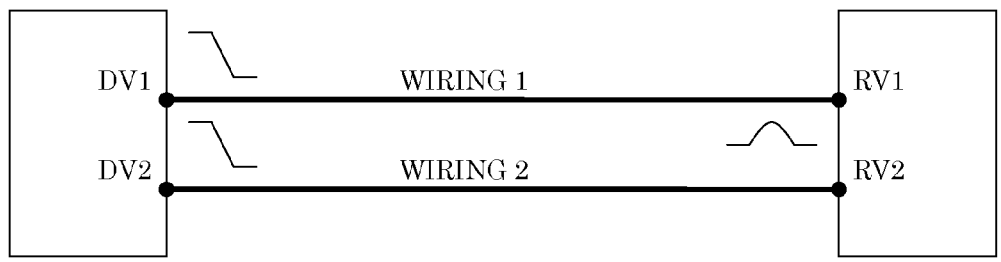
FIG. 12 is a conceptual view showing an example of a delay variation of case D14.
Figure 13:
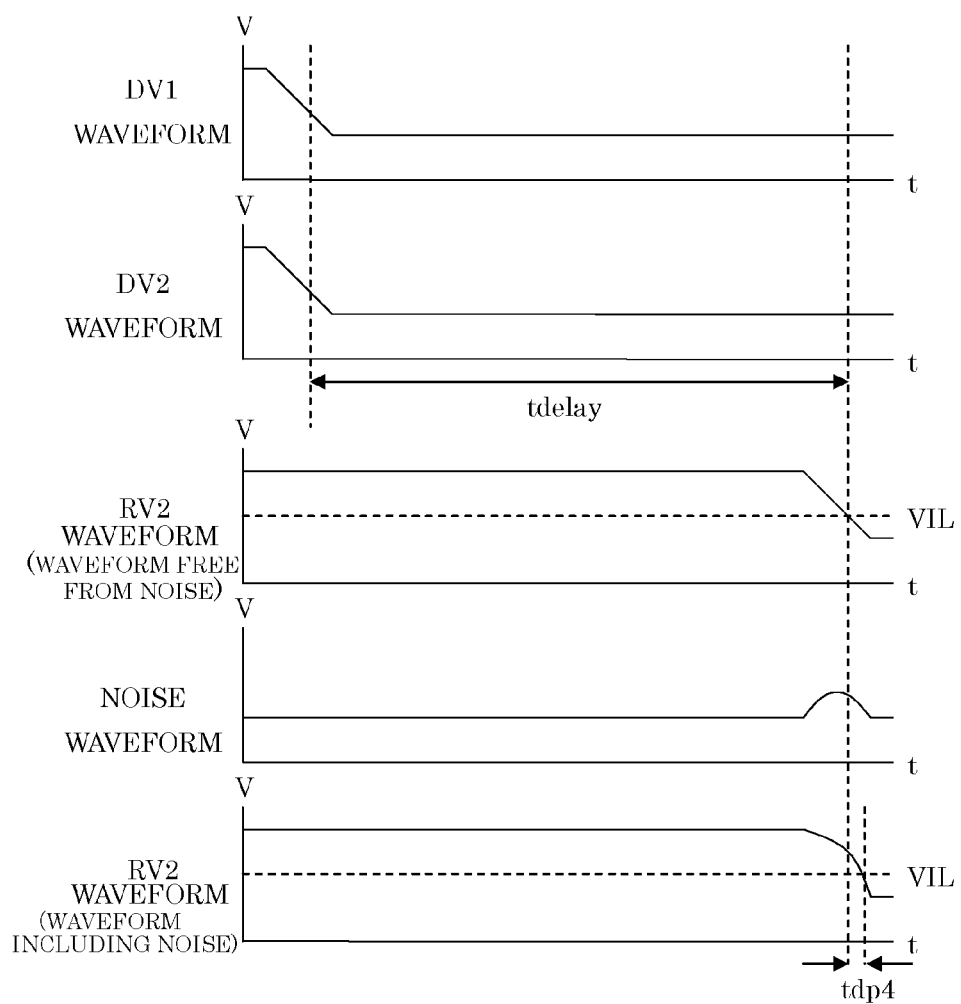
FIG. 13 is a timing chart showing an example of a delay variation of case D14.

Case D14 shows a delay variation in the case where both DV1 and DV2 waveforms are falling edges. FIG. 12 is a conceptual view showing an example of a delay variation of case D14. FIG. 12 roughly illustrates the waveforms of DV1, DV2, and RV2. FIG. 13 is a timing chart showing an example of a delay variation of case D14. FIG. 11 illustrates, from the top, (a) DV1 waveform, (b) DV2 waveform, (c) RV2 waveform free from noise, (d) noise waveform, and (e) RV2 waveform including noise. As illustrated, a delay of RV2 with respect to DV2 is increased by a delay variation tpd4 due to occurrence of crosstalk noise.

A delay variation of case D15 will be described below.

Figure 14:
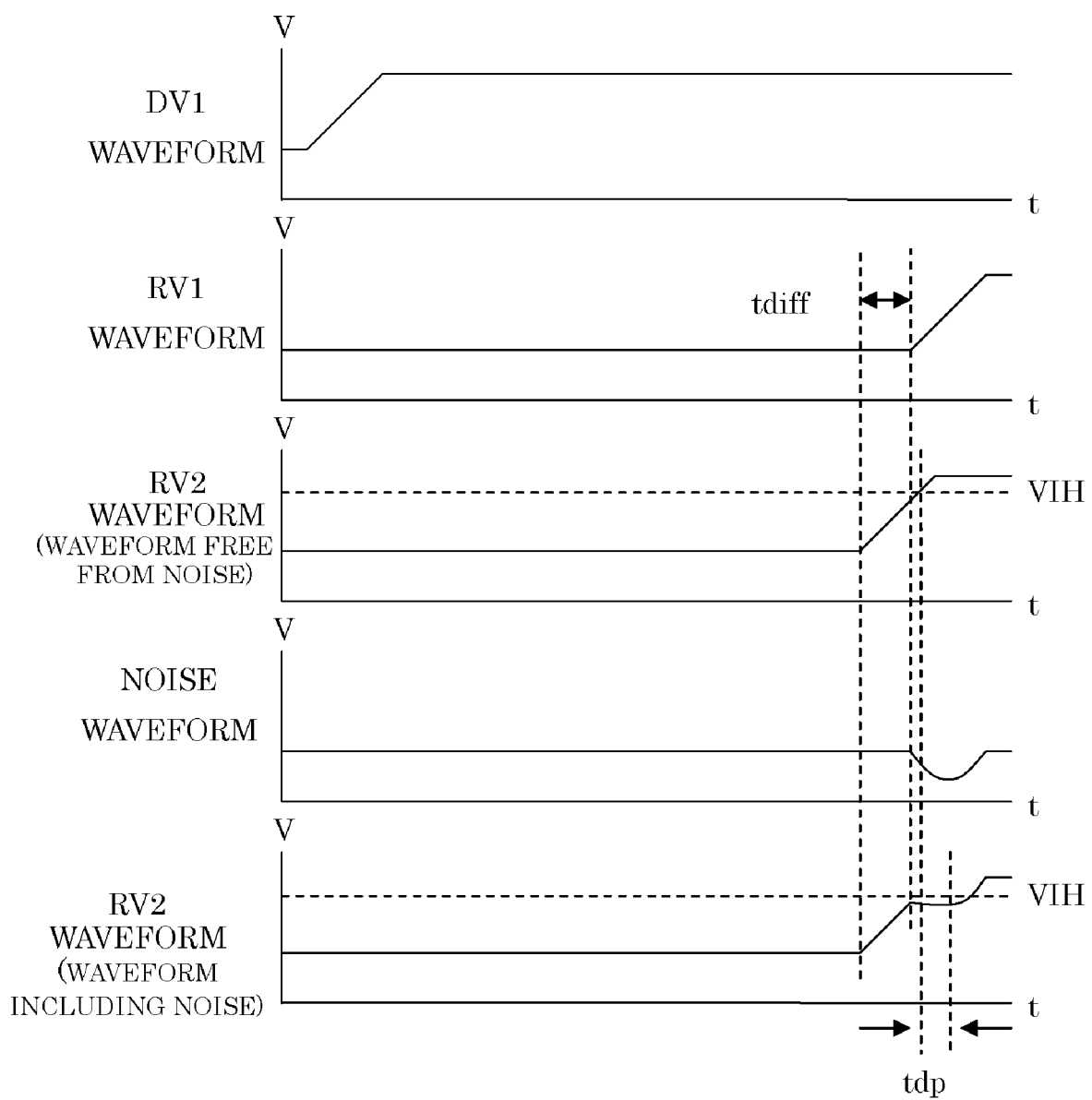
FIG. 14 is a timing chart showing an example of a delay variation of case D15.

Case D15 shows a delay variation in the case where voltage change timing is not the same between DV1 and DV2. FIG. 14 is a timing chart showing an example of a delay variation of case D15. FIG. 14 illustrates, from the top, (a) DV1 waveform, (b) DV2 waveform, (c) RV2 waveform free from noise, (d) noise waveform, and (e) RV2 waveform including noise. tdiff is a difference between a delay time of RV1 and delay time of RV2.

As illustrated, in the case where the timing at which crosstalk noise is superimposed on a signal is not uniform, the delay variation tdp may increase as compared to the case where the timing at which crosstalk noise is superimposed on a signal is uniform. Therefore, in a conventional delay variation calculation method, the voltage change timing between the DV1 and DV2 is varied step by step to set a large number of cases, and simulations are performed for respective cases.

The outline of delay variation calculation processing according to the present embodiment will be described below.

Figure 15:
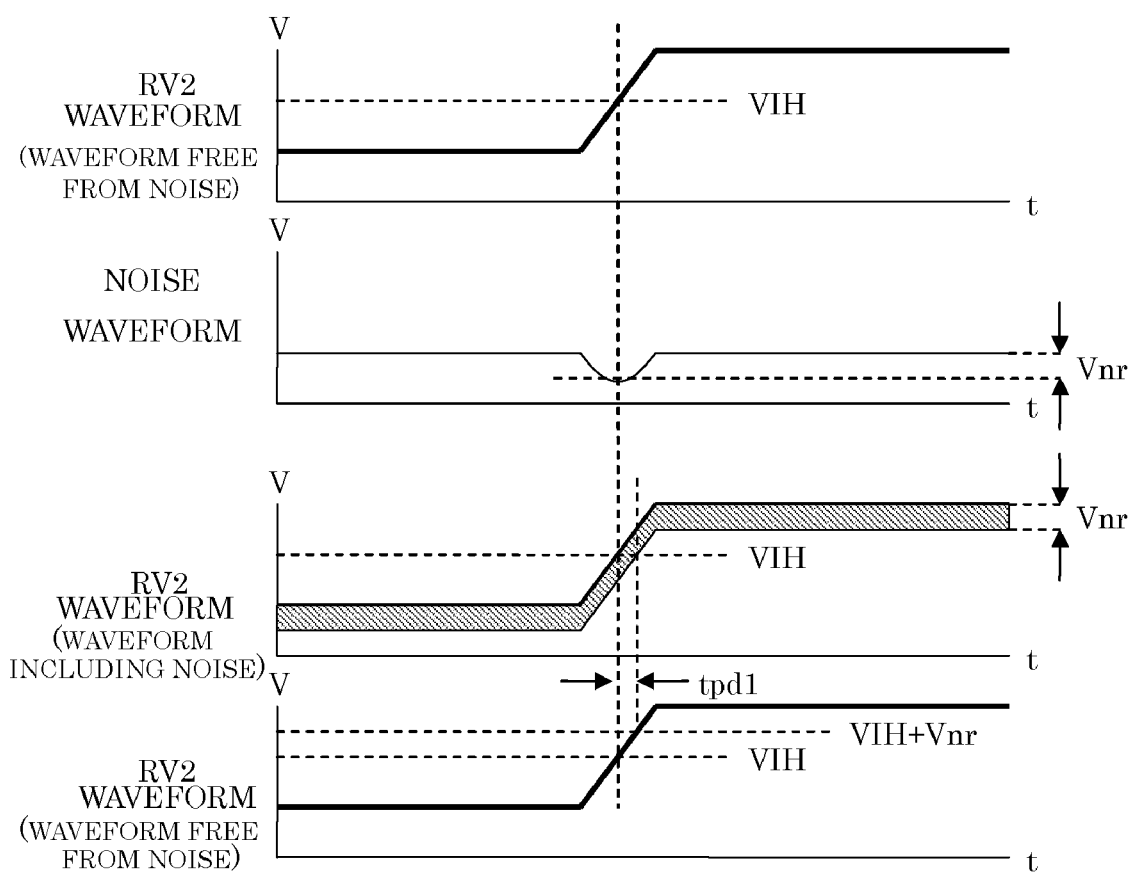
FIG. 15 is a timing chart showing an example of delay variation calculation processing of case D11 according to a first embodiment.

FIG. 15 is a timing chart showing an example of delay variation calculation processing of case D11 according to the first embodiment. FIG. 15 illustrates, from the top, (a) RV2 waveform free from noise, (b) noise waveform, (c) RV2 waveform including noise, and (d) RV2 waveform free from noise for explaining the principle of the present embodiment. The shaded area in (c) represents an area between the waveform (a) and a waveform obtained by subtracting Vnr from waveform (a).

In this case, at whatever timing waveform (b) is superimposed on waveform (a), the RV2 waveform including noise falls within the shaded area of (c). Therefore, when a delay at the point in the shaded area at which the time at which RV2 reaches the VIH is largest is measured, the delay variation tpd1 can be obtained.

In other words, this measurement point corresponds to the point at which the noise free RV2 waveform reaches VIHr (=VIH+Vnr) as shown in (d). Therefore, a transmission delay analyzing apparatus according to the present embodiment can calculate the delay variation tpd1 by measuring the delay time difference only at two points of VIH and VIHr with respect to the noise free RV2 waveform. That is, the delay variation tpd1 can be measured without requiring a plurality of simulations performed with the voltage change timing between the DV1 and DV2 varied step by step, thereby simplifying the delay variation calculation processing as compared to the above-mentioned conventional method. The delay variations tpd2, tpd3, and tpd4 can be measured in the same manner.

In the above examples, a delay of a noise free reception signal is measured using a threshold changed by a value corresponding to the maximum amplitude of noise. Alternatively, however, in place of changing the threshold value, a delay of a signal obtained by changing the level of a noise free reception signal by the maximum amplitude of noise may be measured.

Figure 16:
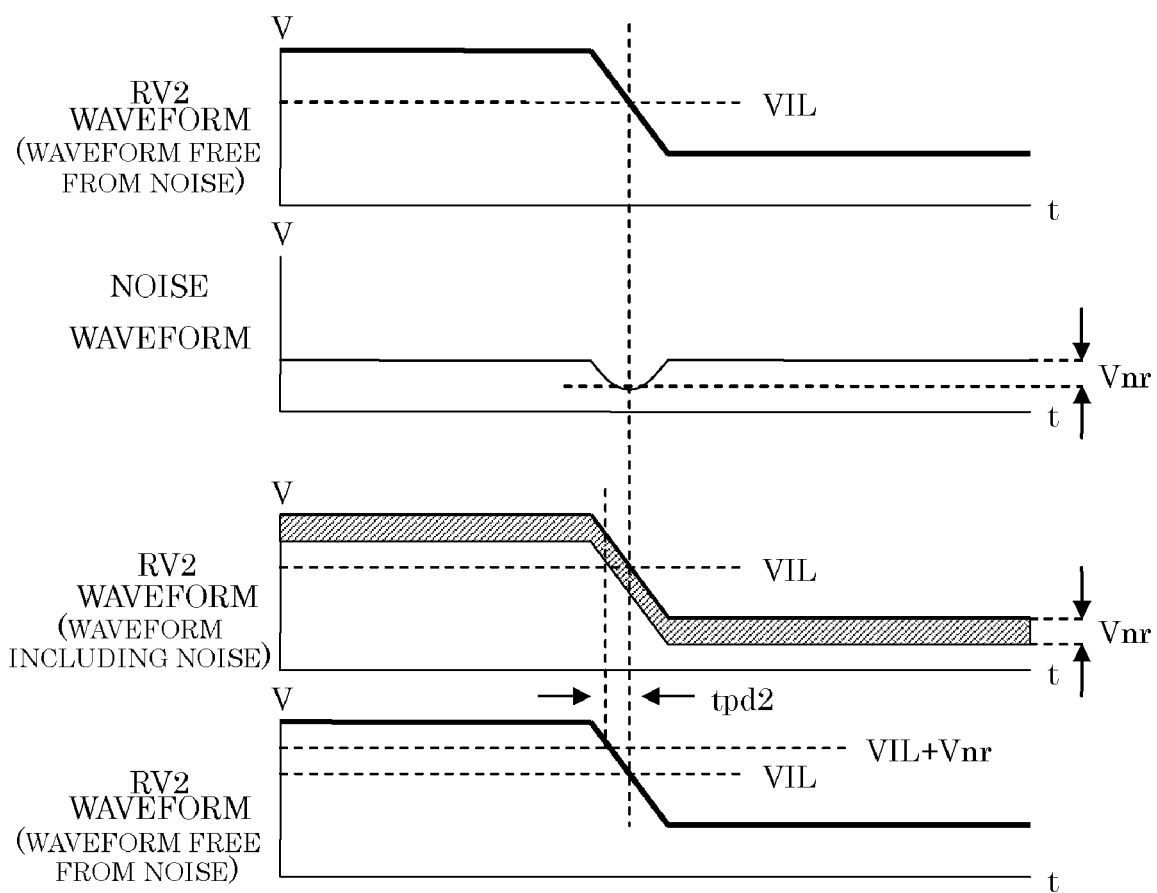
FIG. 16 is a timing chart showing an example of delay variation calculation processing of case D12 according to the first embodiment.

FIG. 16 is a timing chart showing an example of delay variation calculation processing of case D12 according to the first embodiment. FIG. 16 illustrates, from the top, (a) RV2 waveform free from noise, (b) noise waveform, (c) RV2 waveform including noise, and (d) RV2 waveform free from noise for explaining the principle of the present embodiment. The shaded area in (c) represents an area between the waveform (a) and a waveform obtained by subtracting Vnr from waveform (a). The delay variation tpd2 can be calculated by this delay variation calculation processing of case D12.

Figure 17:
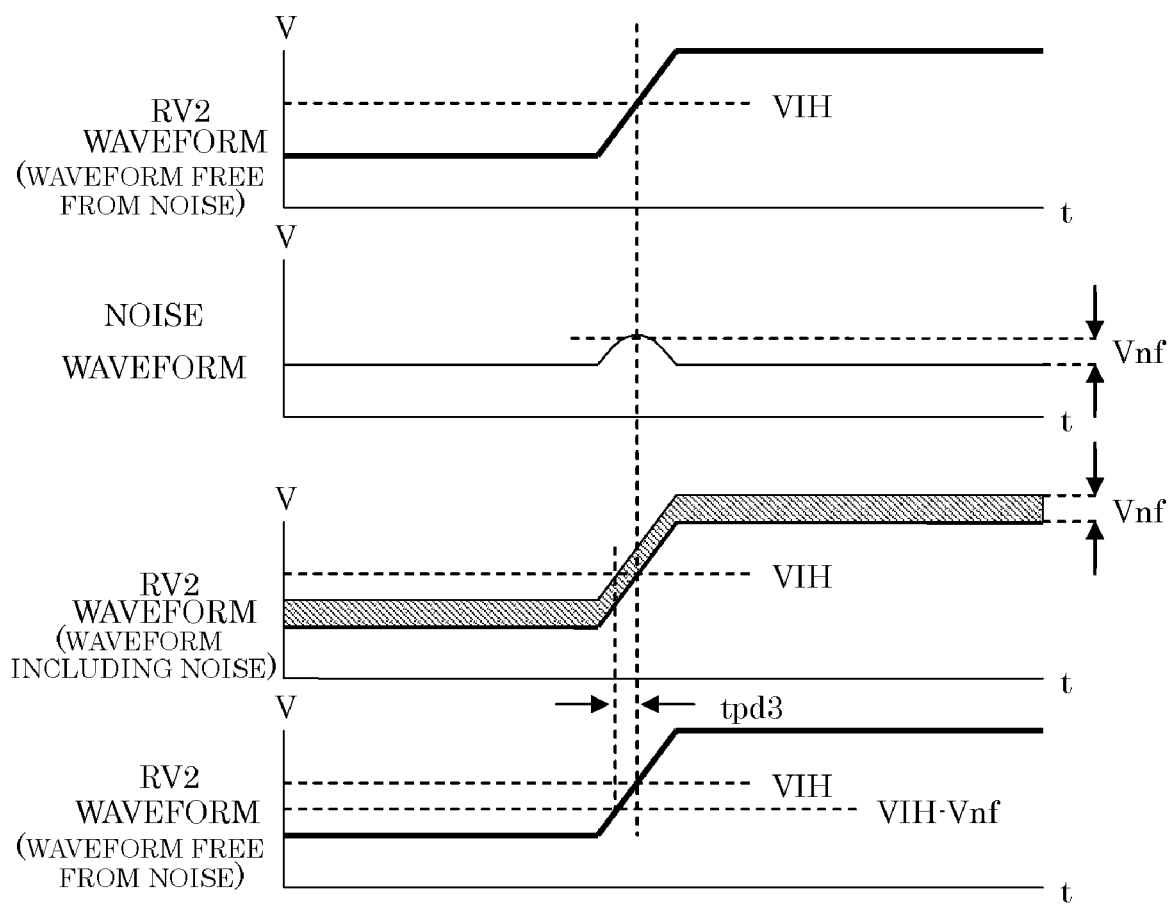
FIG. 17 is a timing chart showing an example of delay variation calculation processing of case D13 according to the first embodiment.

FIG. 17 is a timing chart showing an example of delay variation calculation processing of case D13 according to the first embodiment. FIG. 17 illustrates, from the top, (a) RV2 waveform free from noise, (b) noise waveform, (c) RV2 waveform including noise, and (d) RV2 waveform free from noise for explaining the principle of the present embodiment. The shaded area in (c) represents an area between the waveform (a) and a waveform obtained by adding Vnr to waveform (a). The delay variation tpd3 can be calculated by this delay variation calculation processing of case D13.

Figure 18:
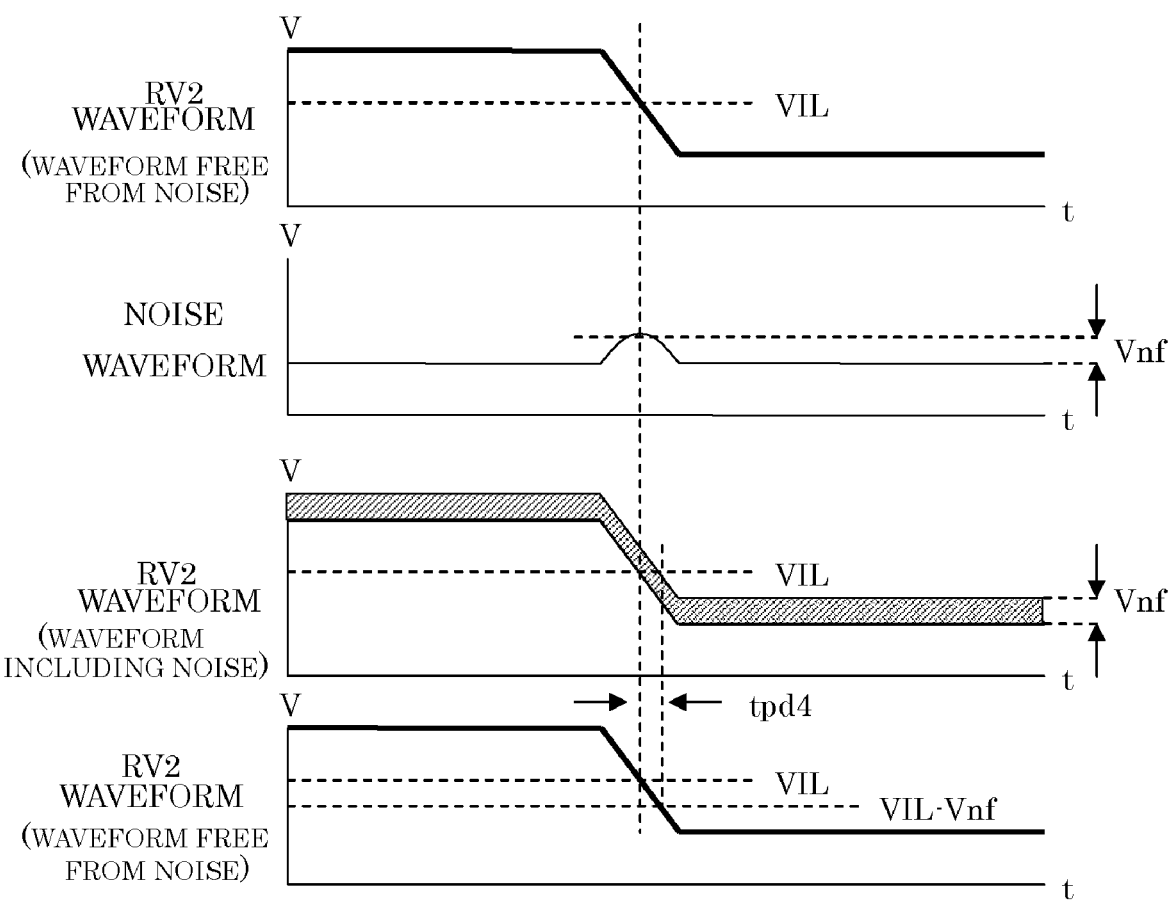
FIG. 18 is a timing chart showing an example of delay variation calculation processing of case D14 according to the first embodiment.

FIG. 18 is a timing chart showing an example of delay variation calculation processing of case D14 according to the first embodiment. FIG. 18 illustrates, from the top, (a) RV2 waveform free from noise, (b) noise waveform, (c) RV2 waveform including noise, and (d) RV2 waveform free from noise for explaining the principle of the present embodiment. The shaded area in (c) represents an area between the waveform (a) and a waveform obtained by adding Vnr to waveform (a). The delay variation tpd4 can be calculated by this delay variation calculation processing of case D14.

In the case where the DV2 waveform is a rising edge, tpd1 and tpd3 can be calculated in a single delay variation calculation processing step, respectively. In the case where the DV2 waveform is a falling edge, tpd2 and tpd4 can be calculated in a single delay variation calculation processing step, respectively. Therefore, the number of simulations can further be reduced.

According to the delay variation calculation processing, the delay variation can be calculated when the maximum amplitude Vnr or maximum amplitude Vnf of a crosstalk noise voltage becomes clear, provided that the rising gradient and falling gradient of the transmission signal waveform are uniform. Delay variation calculation formulas are as follows.

In case where RV2 waveform is rising edge
Delay variation (delay side)

$$tpd1=(Vnr)/\alpha up$$

Delay variation (advance side)

$$tpd3=(Vnf)/\alpha up$$

αup: gradient of rising edge of RV2 waveform
In case where RV2 waveform is falling edge
Delay variation (delay side)

$$tpd4=(Vnf)/\alpha dn$$

Delay variation (advance side)

$$tpd2=(Vnr)/\alpha dn$$

αdn: gradient of falling edge of RV2 waveform

A transmission delay analyzing apparatus that analyzes influence of the crosstalk noise occurring in the first analysis target circuit will be described below.

A configuration of the transmission delay analyzing apparatus will first be described.

Figure 19:
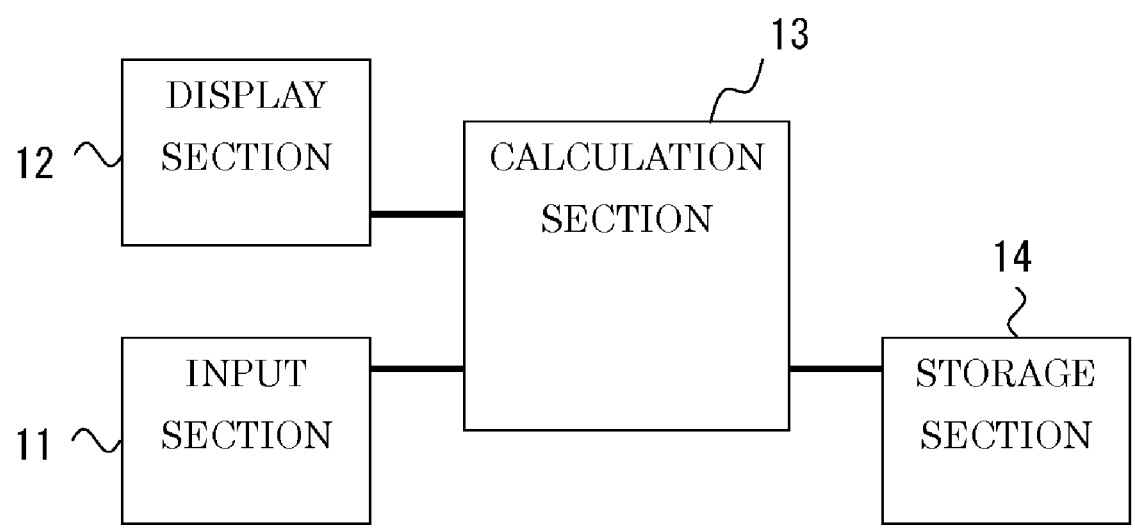
FIG. 19 is a block diagram showing an example of a configuration of a transmission delay analyzing apparatus according to the first embodiment.

FIG. 19 is a block diagram showing an example of a configuration of the transmission delay analyzing apparatus according to the first embodiment. The transmission delay analyzing apparatus shown in FIG. 19 includes an input section 11, a display section 12, a calculation section 13, and a storage section 14. The input section 11 receives a user input designating a circuit model of the analysis target circuit and analysis content and transmits the received information to the calculation section 13. The calculation section 13 performs transmission waveform simulation based on the circuit model of the analysis target circuit and analysis content to obtain a analysis result. The storage section 14 stores the circuit model of the analysis target circuit, analysis content, and analysis result. The display section 12 displays the circuit model, analysis content, and analysis result.

Operation of the transmission delay analyzing apparatus according to the present embodiment will next be described.

Figure 20:
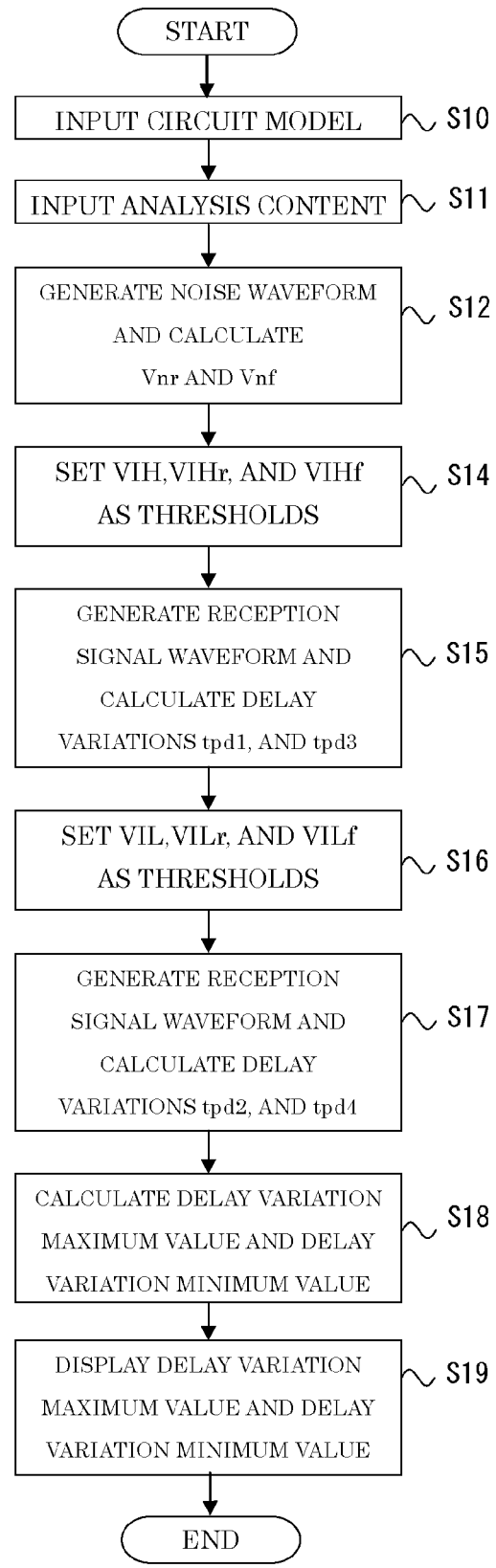
FIG. 20 is a flowchart showing an example of operation of the transmission delay analyzing apparatus according to the first embodiment.

FIG. 20 is a flowchart showing an example of operation of the transmission delay analyzing apparatus according to the first embodiment. The calculation section 13 acquires, from the input section 11, the circuit model of the analysis target model which has been input by a user and stores the acquired circuit model in the storage section 14 (S10). The calculation section 13 then acquires, from the input section 11, the analysis content which has been input by the user and stores the acquired analysis content in the storage section 14 (S11). The calculation section 13 then performs the waveform simulation to generate crosstalk noise waveforms corresponding to cases C11 and C12 respectively, calculates the maximum amplitudes Vnr and Vnf from the respective crosstalk noise waveforms, and stores the Vnr and Vnf in the storage section 14 (S12).

Then, the calculation section 13 sets VIH, VIHr, and VIHf as delay measurement thresholds on the receiving LSI side for a case where the transmission waveform is a rising edge (S14). The VIHr and VIHf are represented by the following formulas.

$$VIHr=VIH+Vnr$$

$$VIHf=VIH-Vnf$$

Then, the calculation section 13 performs the waveform simulation to generate a rising reception signal waveform which is free from crosstalk noise, executes the delay variation calculation processing corresponding to that for cases D11 and D13 to calculate the delay variations tpd1 and tpd3, and stores the tpd1 and tpd3 in the storage section 14 (S15).

Then, the calculation section 13 sets VIL, VILr, and VILf as delay measurement thresholds on the receiving LSI side for a case where the transmission waveform is a falling edge (S16). The VILr and VILf are represented by the following formulas.

$$VILr=VIL+Vnr$$

$$VILf=VIL-Vnf$$

Then, the calculation section 13 performs the waveform simulation to generate a falling reception signal waveform which is free from crosstalk noise, executes the delay variation calculation processing corresponding to that for cases D12 and D14 to calculate the delay variations tpd2 and tpd4, and stores the tpd2 and tpd4 in the storage section 14 (S17).

The calculation section 13 compares the delay variations tpd1 and tpd4 and sets a larger one as a delay variation maximum value. Subsequently, the calculation section 13 compares the delay variations tpd2 and tpd3, selects a larger one so as to assign a minus sign thereto, and sets the resultant value as a delay variation minimum value (since this value indicates the direction in which a delay amount is reduced). After that, the calculation section 13 stores the delay variation maximum value and delay variation minimum value in the storage section 14 (S18). Finally, the calculation section 13 displays the delay variation maximum value and delay variation minimum value on the display section 12 (S19) and ends this flow.

According to the present invention, it is possible to effectively calculate a delay variation in the case where the timing is the same between a reception signal and crosstalk noise, i.e., in the case where influence of the crosstalk noise is the largest.

Further, it is possible to eliminate the need to perform the waveform simulation accompanied by a large number of changing operations of the timing between the reception signal and crosstalk noise. Here, the conventional delay variation calculation method and delay variation calculation method according to the present embodiment are compared.

Assuming that the phase shift between the reception signal waveform and crosstalk noise waveform which are to be superimposed is changed from −0.1 nsec to +0.1 nsec in increments of 0.1 nsec in the conventional delay calculation method, twenty one times of analyses are required. Further, there exist a total of four types (combination of two types caused in the cases where reception signal waveform is rising edge and falling edge and two types caused in the cases where a signal waveform that gives crosstalk noise is rising edge and falling edge) of influence of the crosstalk noise, so that a total of eighty four timing superimposing operations are required. In addition, there exists a timing at which the delay variation becomes maximum or minimum between the increments and, in this case, the timing may be missed.

In the delay variation calculation method according to the present embodiment, the superimposing operation of the crosstalk noise is not required, so that the abovementioned eighty four analyses can be omitted to thereby reduce the entire operation time. For example, assuming that it takes three minutes to perform one analysis operation, operation time can be reduced by about four hours (=84 times×3 minutes/per one analysis=252 minutes).

A first acquisition section and a first calculation section correspond to the processing of step S12. A second acquisition section and a second calculation section correspond to the processing of steps S15, S17, and S18.

Second Embodiment

A second analysis target circuit which is a circuit to be analyzed by a transmission delay analyzing apparatus according to a second embodiment will be described below.

Figure 21:
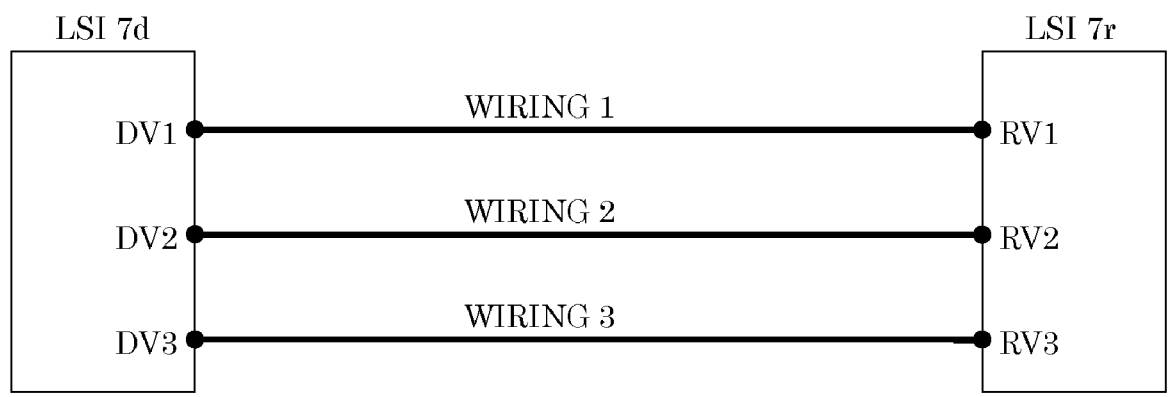
FIG. 21 is a circuit diagram showing an example of a configuration of a second analysis target circuit.

The second analysis target is a circuit having a plurality of wirings that induce crosstalk noise. FIG. 21 is a circuit diagram showing an example of a configuration of the second analysis target circuit. As shown in FIG. 21, the second analysis target circuit has an LSI 7d and an LSI 7r. Wirings 1, 2, and 3 each connect the LSI 7d and LSI 7r for transmitting a signal from the LSI 7d to LSI 7r. A transmission voltage applied to the wiring 1 in the LSI 7d is defined as DV1, transmission voltage applied to the wiring 2 in the LSI 7d is defined as DV2, and transmission voltage applied to the wiring 3 in the LSI 7d is defined as DV3. A reception voltage output from the wiring 1 in the LSI 7r is defined as RV1, reception voltage output from the wiring 2 in the LSI 7r is defined as RV2, and reception voltage output from the wiring 3 in the LSI 7r is defined as RV3.

The definitions of the VIH, VIL, and tdelay are the same as those in the first analysis target circuit. The rising gradient and falling gradient of the DV1 waveform, DV2 waveform, and DV3 waveform are assumed to be uniform.

Some cases of crosstalk noise occurring in the second analysis target circuit will be described.

Crosstalk noise of case C21 will be described below.

Figure 22:
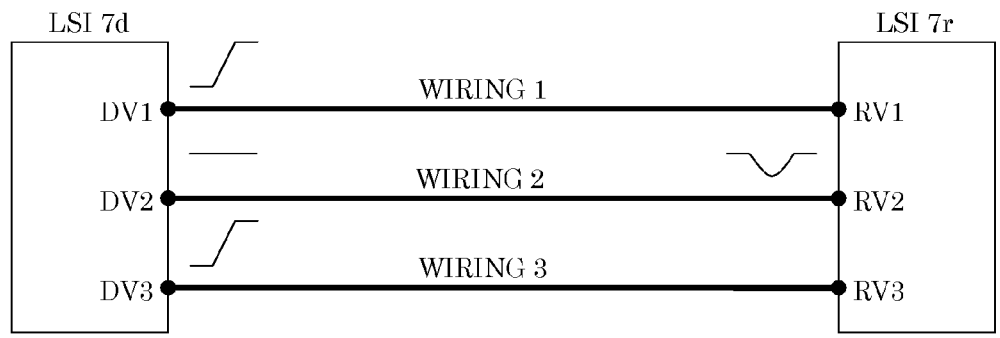
FIG. 22 is a conceptual view showing an example of crosstalk noise of case C21.
Figure 23:
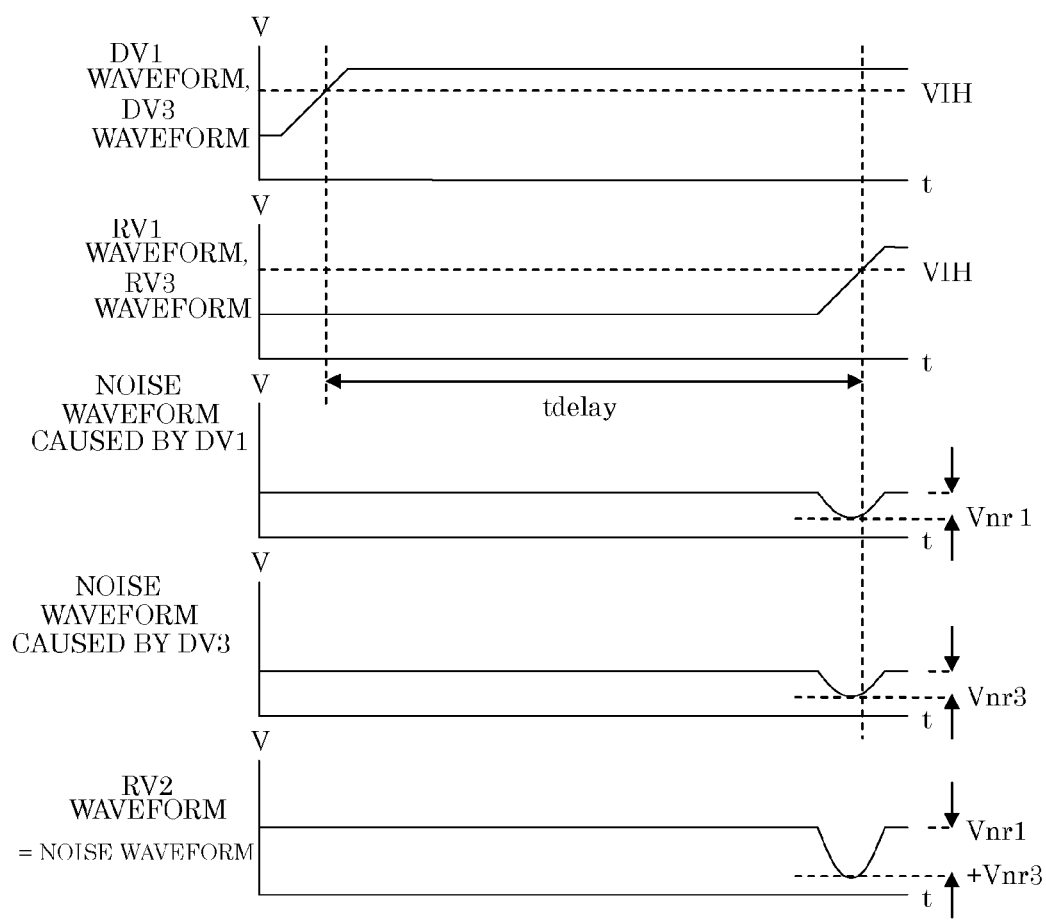
FIG. 23 is a timing chart showing an example of crosstalk noise of case C21.

The case C21 is a case where both DV1 waveform and DV3 waveform are rising edges, the timing is the same between the DV1 and DV3, and crosstalk noise occurs in RV2. FIG. 22 is a conceptual view showing an example of crosstalk noise of case C21. FIG. 22 roughly illustrates the waveforms of DV1, DV2, DV3, and RV2. FIG. 23 is a timing chart showing an example of crosstalk noise of case C21. FIG. 23 illustrates, from the top, (a) DV1 waveform and DV3 waveform, (b) RV1 waveform and RV3 waveform, (c) noise waveform caused by DV1, (d) noise waveform caused by DV3, and (e) RV2 waveform.

The maximum amplitude of a noise voltage caused by DV1 which is shown in (c) is assumed to be Vnr1, and the maximum amplitude of a noise voltage caused by DV3 which is shown in (d) is assumed to be Vnr3. In this case, the maximum amplitude of a crosstalk noise voltage (RV2) is represented by Vnr=Vnr1+Vnr3, as shown in (e). Similarly, in the case where there are three or more wirings that induce crosstalk noise, the total sum of the crosstalk noise caused by respective wirings is given.

Crosstalk noise of case C22 will be described below.

Figure 24:
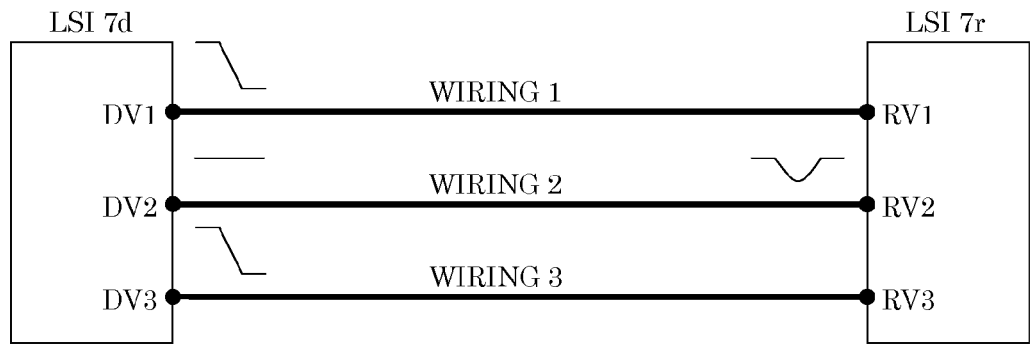
FIG. 24 is a conceptual view showing an example of crosstalk noise of case C22.
Figure 25:
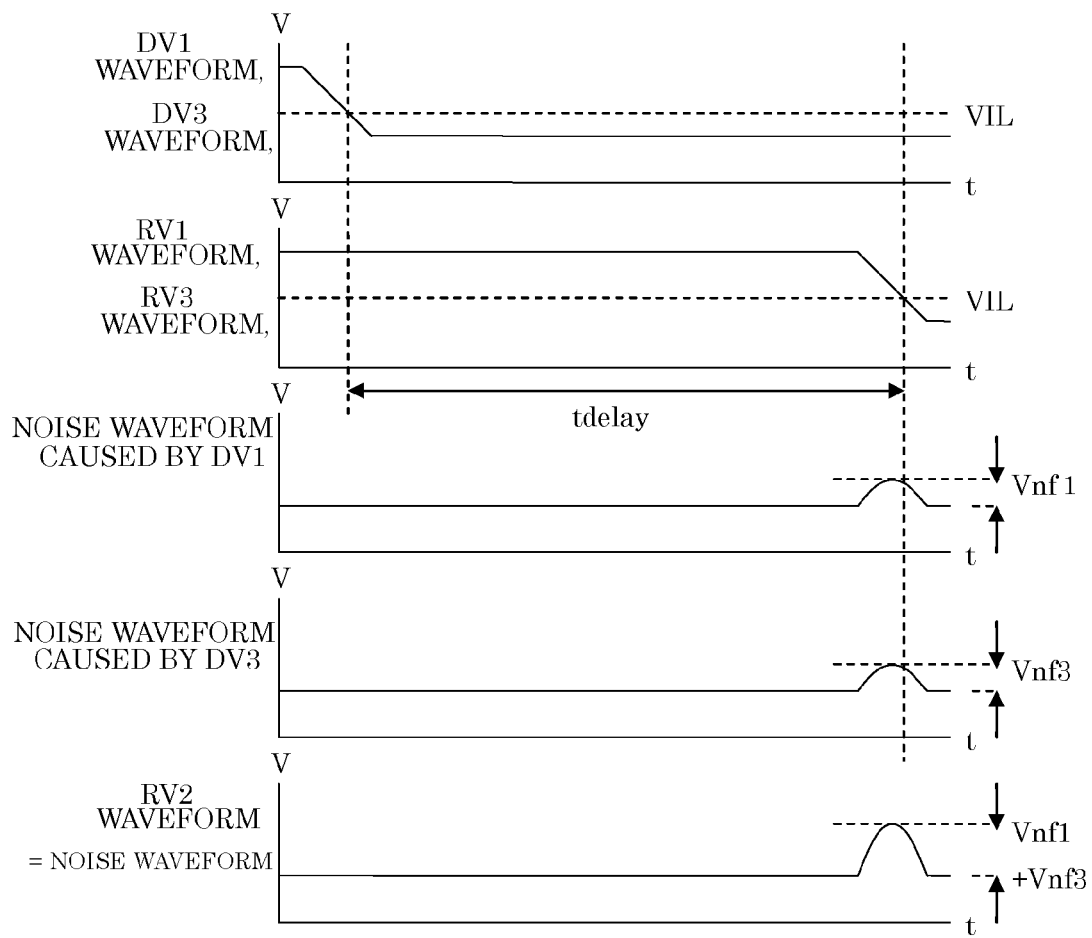
FIG. 25 is a timing chart showing an example of crosstalk noise of case C22.

The case C22 is a case where both DV1 waveform and DV3 waveform are falling edges, the timing is the same between the DV1 and DV3, and crosstalk noise occurs in RV2. FIG. 24 is a conceptual view showing an example of crosstalk noise of case C22. FIG. 24 roughly illustrates the waveforms of DV1, DV2, DV3, and RV2. FIG. 25 is a timing chart showing an example of crosstalk noise of case C22. FIG. 25 illustrates, from the top, (a) DV1 waveform and DV3 waveform, (b) RV1 waveform and RV3 waveform, (c) noise waveform caused by DV1, (d) noise waveform caused by DV3, and (e) RV2 waveform.

The maximum amplitude of a noise voltage caused by DV1 which is shown in (c) is assumed to be Vnf1, and the maximum amplitude of a noise voltage caused by DV3 which is shown in (d) is assumed to be Vnf3. In this case, the maximum amplitude of a crosstalk noise voltage (RV2) is represented by Vnf=Vnf1+Vnf3, as shown in (e). Similarly, in the case where there are three or more wirings that induce crosstalk noise, the total sum of the crosstalk noise caused by respective wirings is given.

A transmission delay analyzing apparatus that analyzes influence of the crosstalk noise occurring in the second analysis target circuit will be described below.

A configuration of the transmission delay analyzing apparatus according to the present embodiment is the same as that of the transmission delay analyzing apparatus according to the first embodiment.

Operation of the transmission delay analyzing apparatus according to the present embodiment will next be described.

Figure 26:
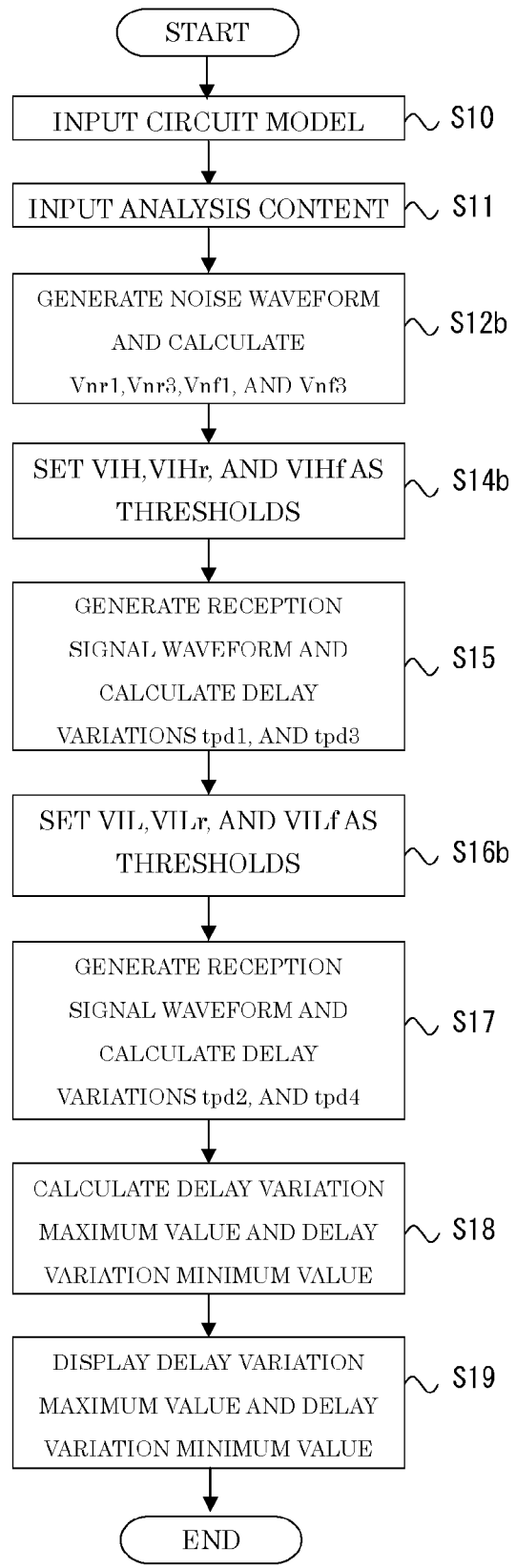
FIG. 26 is a flowchart showing an example of operation of a transmission delay analyzing apparatus according to a second embodiment.

FIG. 26 is a flowchart showing an example of operation of the transmission delay analyzing apparatus according to the second embodiment. In FIG. 26, the same reference numerals as those in FIG. 20 denote the same or corresponding processing as those in FIG. 20, and the descriptions thereof will be omitted here.

The calculation section 13 executes steps S10 and S11. Then, in place of step S12, the calculation section 13 performs the waveform simulation to generate a plurality of crosstalk noise waveforms corresponding to case C21, calculates the maximum amplitudes Vnr1, Vnr3, Vnf1, and Vnf3 from the respective crosstalk noise waveforms, and stores the Vnr1, Vnr3, Vnf1, and Vnf3 in the storage section 14 (S12b).

Then, the calculation section 13 executes the same processing as step S14 (S14b). However, the definitions of the VIHr and VIHf differ from those in the first embodiment. The VIHr and VIHf are represented by the following formulas.

$$VIHr = VIH + Vnr1 + Vnr3$$

$$VIHf = VIH - Vnf1 - Vnf3$$

Subsequently, the calculation section 13 executes step S15.

The calculation section 13 then executes the same processing as step S16 (S16b). However, the definitions of the VILr and VILf differ from those in the first embodiment. The VILr and VILf are represented by the following formulas.

$$VILr = VIL + Vnr1 + Vnr3$$

$$VILf = VIL - Vnf1 - Vnf3$$

The calculation section 13 then executes steps S17, S18, and S19 and ends this flow.

According to the present embodiment, it is possible to effectively calculate a delay variation in the case where the timing is the same between a reception signal and a plurality of crosstalk noise, i.e., in the case where influence of the crosstalk noise is the largest.

Third Embodiment

In the present embodiment, the transmission delay analyzing apparatus that analyzes influence of the crosstalk noise occurring in the second analysis target circuit will be described below.

A configuration of the transmission delay analyzing apparatus according to the present embodiment is the same as that of the transmission delay analyzing apparatus according to the first embodiment.

Operation of the transmission delay analyzing apparatus according to the present embodiment will next be described.

Figure 27:
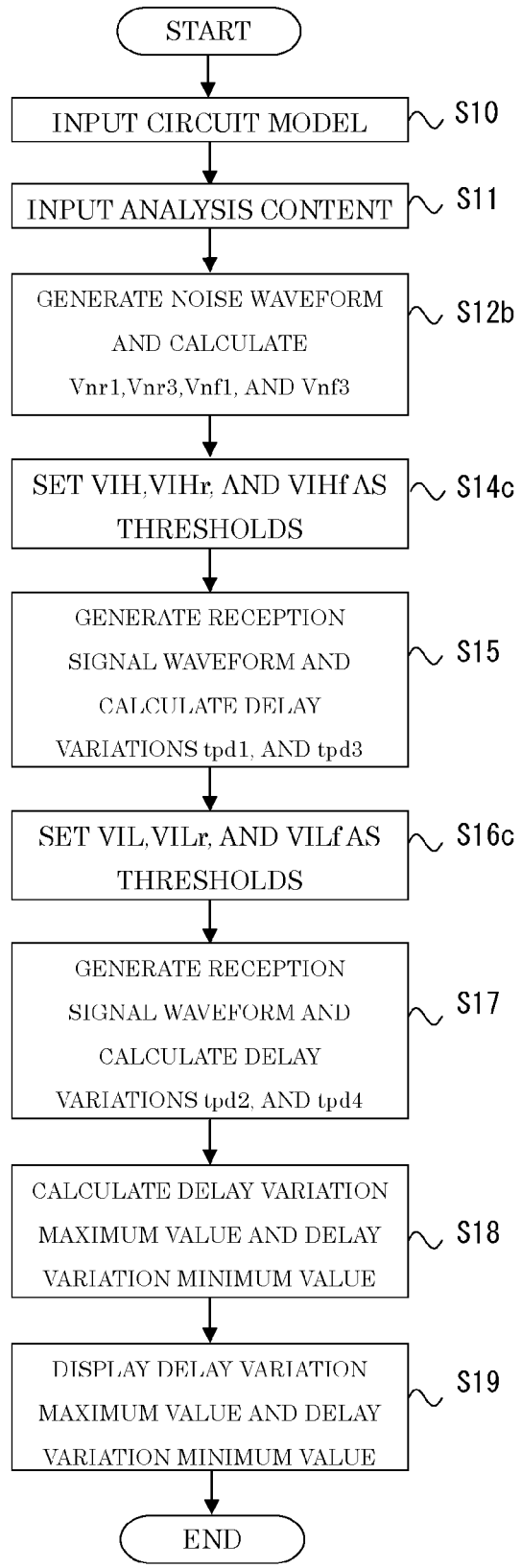
FIG. 27 is a flowchart showing an example of operation of a transmission delay analyzing apparatus according to a third embodiment.

FIG. 27 is a flowchart showing an example of operation of the transmission delay analyzing apparatus according to the third embodiment. In FIG. 27, the same reference numerals as those in FIG. 26 denote the same or corresponding processing as those in FIG. 26, and the descriptions thereof will be omitted here.

The calculation section 13 executes steps S10, S11, and S12b.

Then, the calculation section 13 executes the same processing as step S14b (S14c). However, the definitions of the VIHr and VIHf differ from those in the second embodiment. FIG. 28 is formulas showing an example of thresholds VIHr and VIHf according to the third embodiment. In each formula, the amplitude obtained after synthesis of all crosstalk noise is defined as the square mean value of the maximum amplitudes of the respective crosstalk noise.

Subsequently, the calculation section 13 executes step S15.

Then, the calculation section 13 executes the same processing as step S16b (S16c). However, the definitions of the VILr and VILf differ from those in the second embodiment. FIG. 29 is formulas showing an example of thresholds VILr and VILf according to the third embodiment. In each formula, the amplitude obtained after synthesis of all crosstalk noise is defined as the square mean value of the maximum amplitudes of the respective crosstalk noise, as in the case of step S14c.

After that, the calculation section 13 executes steps S17, S18, and S19 and ends this flow.

According to the present embodiment, in the case where the timing of a signal receiving the crosstalk noise and the timing of a signal giving the crosstalk noise are independent of one another, the amplitude obtained after synthesis of all crosstalk noise is defined as the square mean value of the maximum amplitudes of the respective crosstalk noise, whereby it is possible to effectively calculate a delay variation close to an actual measurement value.

Fourth Embodiment

Case SS of simultaneous switching noise will be described below.

Figure 30:
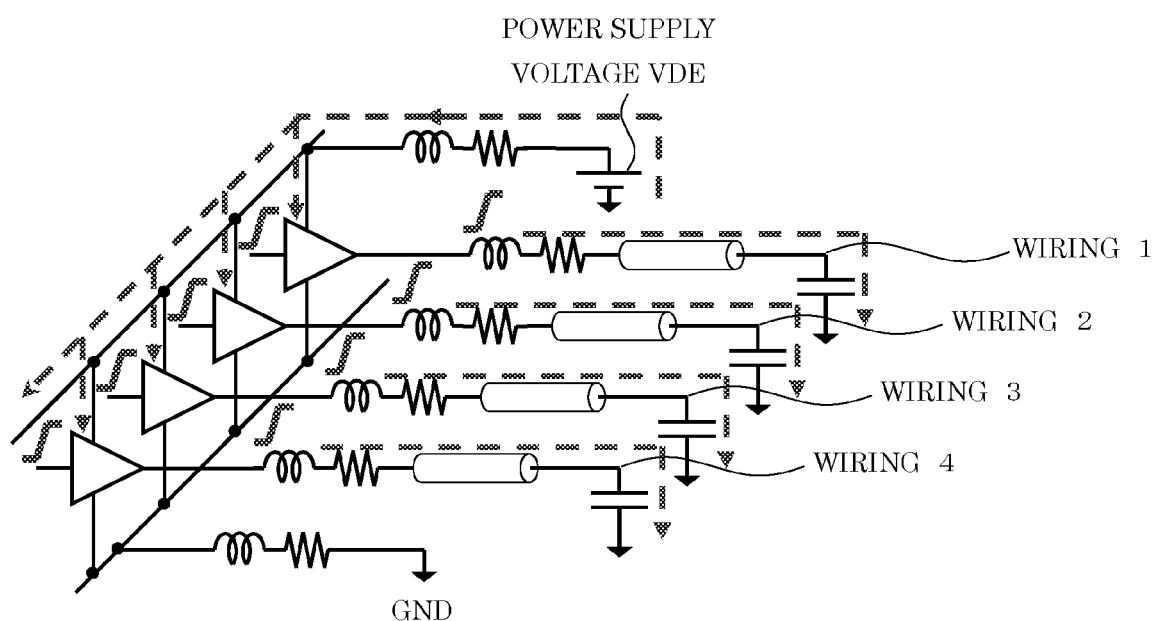
FIG. 30 is a conceptual view showing an example of simultaneous switching noise in case SS.

FIG. 30 is a conceptual view showing an example of simultaneous switching noise in case SS. Simultaneous switching noise occurs in wirings 1, 2, 3, and 4 in a circuit shown in FIG. 30.

That is, when rising edges or falling edges of signals are simultaneously generated in a plurality of wirings 1, 2, 3, and 4 in a circuit, current flows at a burst decrease a power supply voltage VDE, with the result that the simultaneous switching noise is generated in the respective wirings (transmission lines). Arrows in the drawing denote the direction of the current.

Figure 31:
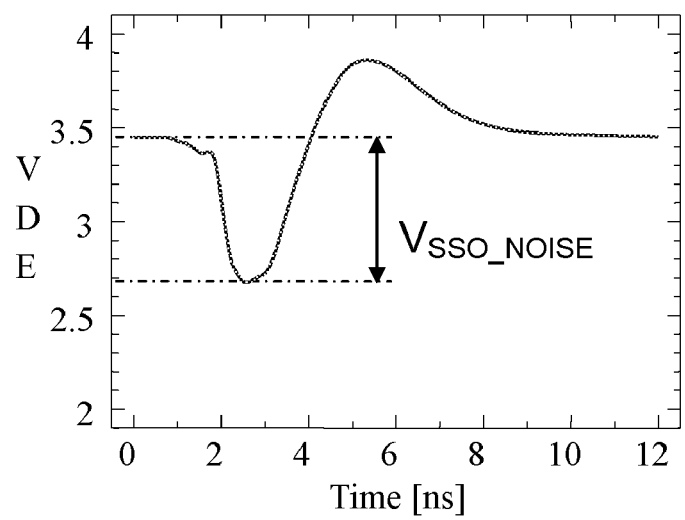
FIG. 31 is a view showing an example of a waveform of a power supply voltage in case SS.

FIG. 31 is a view showing an example of a waveform of a power supply voltage in case SS. In FIG. 31, the horizontal axis represents time, and vertical axis represents a power supply voltage VDE. $V_{SSO\_NOISE}$ represents the maximum amplitude of a change in the VDE value caused by the simultaneous switching.

Figure 32:
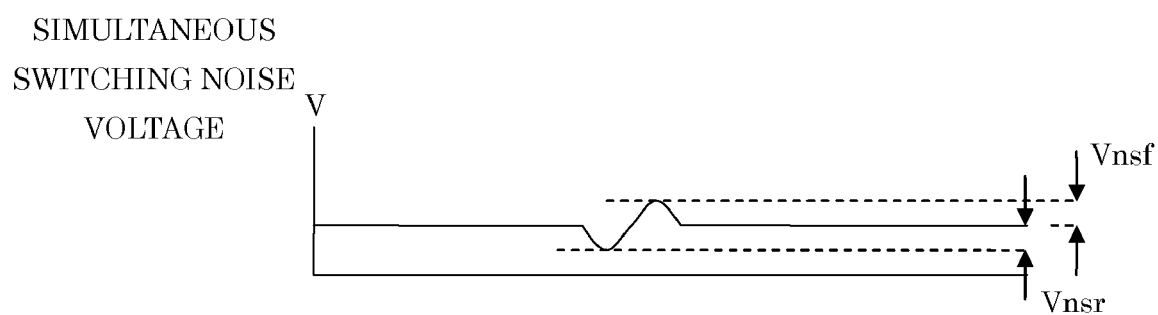
FIG. 32 is a view showing an example of a simultaneous switching noise waveform in case SS.

FIG. 32 is a view showing an example of a simultaneous switching noise waveform in case SS. In FIG. 32, the horizontal axis represents time, and vertical axis represents a simultaneous switching noise voltage. Simultaneous switching noise exhibiting the same variation as that of the VDE occurs in a given wiring. Vnsr denotes the positive maximum amplitude of the simultaneous switching noise voltage, and Vnsf denotes the negative maximum amplitude of the simultaneous switching noise voltage.

The transmission delay analyzing apparatus that analyzes influence of the crosstalk noise and simultaneous switching noise occurring in the above-mentioned first analysis target circuit will be described.

A configuration of the transmission delay analyzing apparatus is the same as that of the first embodiment.

Operation of the transmission delay analyzing apparatus according to the present embodiment will be described below.

Figure 33:
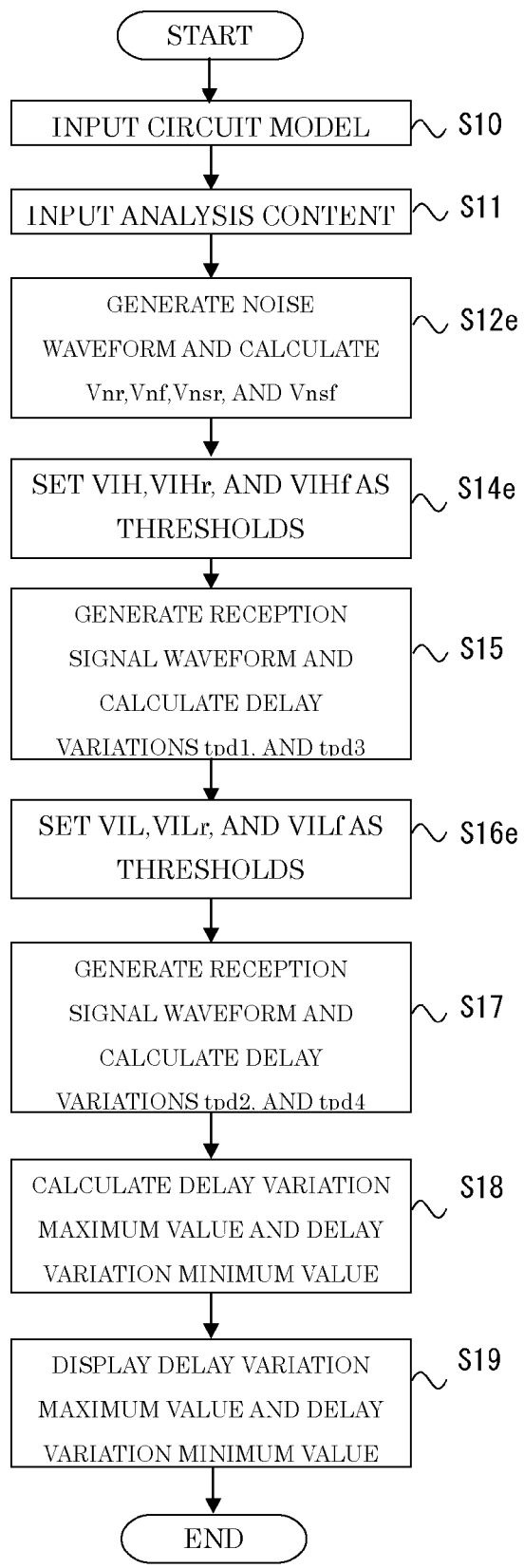
FIG. 33 is a flowchart showing an example of operation of a transmission delay analyzing apparatus according to a fourth embodiment.

FIG. 33 is a flowchart showing an example of operation of the transmission delay analyzing apparatus according to the fourth embodiment. In FIG. 33, the same reference numerals as those in FIG. 20 denote the same or corresponding processing as those in FIG. 20, and the descriptions thereof will be omitted here.

The calculation section 13 executes steps S10, S11, and S12.

Then, in addition to the processing of step S12, the calculation section 13 executes the waveform simulation corresponding to that for case SS to generate a simultaneous switching noise waveform, calculates the maximum amplitudes Vnsr and Vnsf from the simultaneous switching noise waveform, and stores Vnr, Vnf, Vnsr, and Vnsf in the storage section 14 (S12e).

Then, the calculation section 13 executes the same processing as step S14 (S14e). However, the definitions of the VIHr and VIHf differ from those in the first embodiment. The VIHr and VIHf are represented by the following formulas.

$VIHr=VIH+Vnr+Vnsr$ $VIHf=VIH-Vnf-Vnsf$

Subsequently, the calculation section 13 executes step S15.

The calculation section 13 then executes the same processing as step S16 (Sl6e). However, the definitions of the VILr and VILf differ from those in the first embodiment. The VILr and VILf are represented by the following formulas.

$VILr=VIL+Vnr+Vnsr$ $VILf=VIL-Vnf-Vnsf$

The calculation section 13 then executes steps S17, S18, and S19 and ends this flow.

According to the present embodiment, it is possible to effectively calculate a delay variation in the case where the timing is the same among a reception signal, crosstalk noise, and simultaneous switching noise, i.e., in the case where influence of the crosstalk noise is the largest.

Fifth Embodiment

In the present embodiment, the transmission delay analyzing apparatus that analyzes influence of the crosstalk noise and simultaneous switching noise occurring in the above-mentioned first analysis target circuit will be described below.

A configuration of the transmission delay analyzing apparatus according to the present embodiment is the same as that of the transmission delay analyzing apparatus according to the first embodiment.

Operation of the transmission delay analyzing apparatus according to the present embodiment will next be described.

Figure 34:
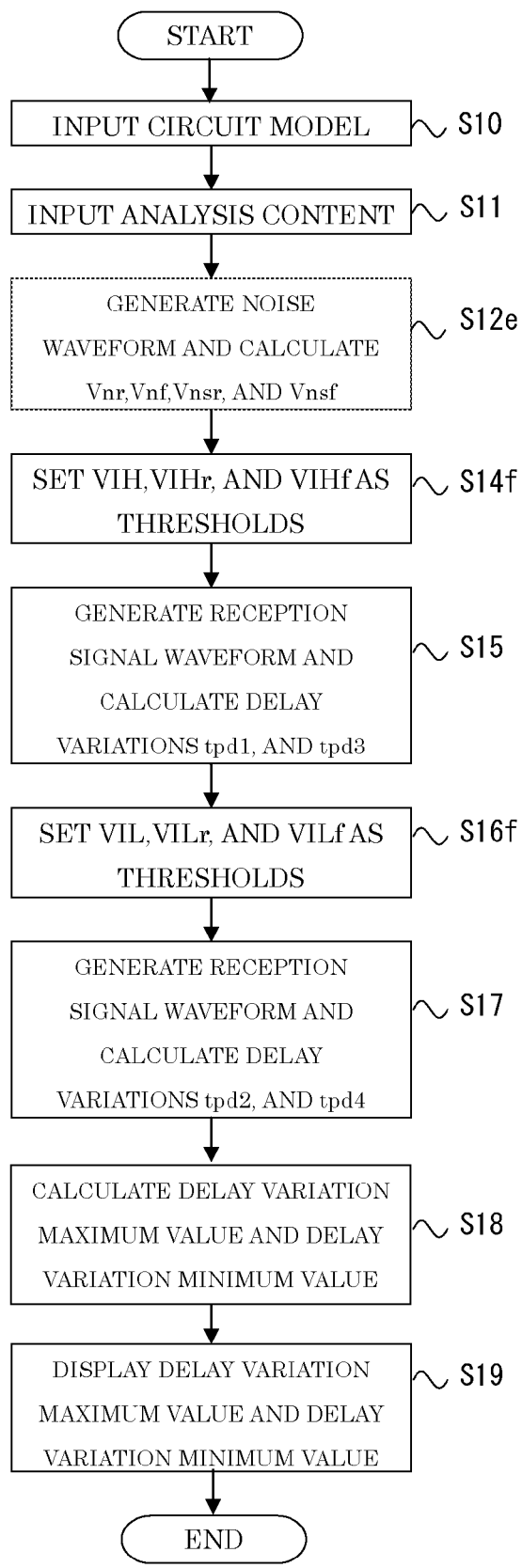
FIG. 34 is a flowchart showing an example of operation of a transmission delay analyzing apparatus according to a fifth embodiment.

FIG. 34 is a flowchart showing an example of operation of the transmission delay analyzing apparatus according to the fifth embodiment. In FIG. 34, the same reference numerals as those in FIG. 33 denote the same or corresponding processing as those in FIG. 33, and the descriptions thereof will be omitted here.

The calculation section 13 executes steps S10, S11, and S12e.

Then, the calculation section 13 executes the same processing as step S14e (S14f). However, the definitions of the VIHr and VIHf differ from those in the fourth embodiment. FIG. 35 is formulas showing an example of thresholds VIHr and VIHf according to the fifth embodiment. In each formula, the amplitude obtained after synthesis of the crosstalk noise and simultaneous switching noise is defined as the square mean value of the maximum amplitudes of the respective noise.

Subsequently, the calculation section 13 executes step S15.

Then, the calculation section 13 executes the same processing as step S16e (S16f). However, the definitions of the VILr and VILf differ from those in the fourth embodiment. FIG. 36 is formulas showing an example of thresholds VILr and VILf according to the fifth embodiment. In each formula, the amplitude obtained after synthesis of the crosstalk noise and simultaneous switching noise is defined as the square mean value of the maximum amplitudes of the respective noise, as in the case of step S14f.

After that, the calculation section 13 executes steps S17, S18, and S19 and ends this flow.

According to the present embodiment, in the case where the timing of a signal receiving the crosstalk noise, timing of a signal giving the crosstalk noise, and timing of the simultaneous switching noise are independent of one another, the amplitude obtained after synthesis of all crosstalk noise is defined as the square mean value of the maximum amplitudes of the respective crosstalk noise, whereby it is possible to effectively calculate a delay variation close to an actual measurement value.

Further, it is possible to provide a program that allows a computer constituting the transmission delay analyzing apparatus to execute the above steps as a transmission delay analyzing program. By storing the above program in a computer-readable storage medium, it is possible to allow the computer constituting the transmission delay analyzing apparatus to execute the program. The computer-readable medium mentioned here includes: an internal storage device mounted in a computer, such as ROM or RAM, a portable storage medium such as a CD-ROM, a flexible disk, a DVD disk, a magneto-optical disk, or an IC card; a database that holds computer program; another computer and database thereof; and a transmission medium on a network line.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A transmission delay analyzing apparatus that analyzes a delay of a signal which is transmitted from a transmitting circuit to a receiving circuit via a predetermined first transmission line included in a plurality of transmission lines connecting the transmitting and receiving circuits, comprising:
    a first acquisition section that acquires a noise waveform from among waveforms which propagate in the first transmission line and are acquired by the receiving circuit;
    a first calculation section that calculates a noise peak level which is the peak level of the noise waveform acquired by the first acquisition section;
    a second acquisition section that acquires a signal waveform free from noise from among the waveforms which propagate in the first transmission line and are acquired by the receiving circuit; and
    a second calculation section that calculates a delay variation of the transmitted signal based on the signal waveform acquired by the second acquisition section, a threshold for determining the level of a signal that the receiving circuit receives from the first transmission line, and the noise peak level calculated by the first calculation section.

2. The transmission delay analyzing apparatus according to claim 1, wherein
    the second calculation section changes the level of the signal waveform or the threshold based on the noise peak level and compares the level of the signal waveform and the threshold so as to calculate the delay variation.

3. The transmission delay analyzing apparatus according to claim 2, wherein
    the second calculation section adds the noise peak level to the threshold so as to obtain a threshold used for the calculation of the delay variation.

4. The transmission delay analyzing apparatus according to claim 1, wherein
    in the case where a change in the signal waveform is approximated by a straight line, the second calculation section calculates the delay variation based on the noise peak level and gradient of the straight line.

5. The transmission delay analyzing apparatus according to claim 1, wherein
    in the case where there are a plurality of noise sources for the first transmission line, the first acquisition section acquires the noise waveform of each of the plurality of noise sources, and the first calculation section calculates the peak level of the noise waveform of each of the plurality of noise sources and obtains the noise peak level by performing statistical processing for the calculated peak levels.

6. The transmission delay analyzing apparatus according to claim 5, wherein
    the first calculation section sets the maximum value among the peak levels of the noise waveforms generated by the plurality of noise sources as the noise peak level.

7. The transmission delay analyzing apparatus according to claim 5, wherein
    the first calculation section sets a square mean value of the peak levels of the noise waveforms generated by the plurality of noise sources as the noise peak level.

8. The transmission delay analyzing apparatus according to claim 1, wherein
    the noise includes crosstalk noise which is given to the signal propagating in the first transmission line, the crosstalk noise being caused by a change in a signal propagating in a second transmission line which is included in the plurality of the transmission lines and is different from the first transmission line.

9. The transmission delay analyzing apparatus according to claim 1, wherein
    the noise includes simultaneous switching noise which is given from a power supply to the signal propagating in the first transmission line, the simultaneous switching noise being caused by a simultaneous change of signals propagating in the plurality of transmission lines.

10. The transmission delay analyzing apparatus according to claim 1, wherein
    the first acquisition section generates the noise waveform by performing a waveform simulation.

11. The transmission delay analyzing apparatus according to claim 1, wherein
the second acquisition section generates the signal waveform by performing a waveform simulation.

12. A non-transitory computer-readable medium that records a transmission delay analyzing program allowing a computer to execute analysis of a delay of a signal which is transmitted from a transmitting circuit to a receiving circuit via a predetermined first transmission line included in a plurality of transmission lines connecting the transmitting and receiving circuits, the program allowing the computer to execute:
acquiring a noise waveform from among waveforms which propagate in the first transmission line and are acquired by the receiving circuit;
calculating a noise peak level which is the peak level of the acquired noise waveform;
acquiring a signal waveform free from noise from among the waveforms which propagate in the first transmission line and are acquired by the receiving circuit; and
calculating a delay variation of the transmitted signal based on the acquired signal waveform, a threshold for determining the level of a signal that the receiving circuit receives from the first transmission line, and the calculated noise peak level.

13. The non-transitory computer-readable medium recording the transmission delay analyzing program according to claim 12, wherein
the calculating of the delay variation changes the level of the signal waveform or the threshold based on the noise peak level and compares the level of the signal waveform and the threshold so as to calculate the delay variation.

14. The non-transitory computer-readable medium recording the transmission delay analyzing program according to claim 13, wherein
the calculating of the delay variation adds the noise peak level to the threshold so as to obtain a threshold used for the calculation of the delay variation.

15. The non-transitory computer-readable medium recording the transmission delay analyzing program according to claim 12, wherein
in the case where there are a plurality of noise sources for the first transmission line, the acquiring of the noise waveform acquires the noise waveform of each of the plurality of noise sources, calculates the peak level of the noise waveform of each of the plurality of noise sources, and obtains the noise peak level by performing statistical processing for the calculated peak levels.

16. The non-transitory computer-readable medium recording the transmission delay analyzing program according to claim 15, wherein
the calculating of the noise peak level sets the maximum value among the peak levels of the noise waveforms generated by the plurality of noise sources as the noise peak level.

17. The non-transitory computer-readable medium recording the transmission delay analyzing program according to claim 15, wherein
the calculating of the noise peak level sets a square mean value of the peak levels of the noise waveforms generated by the plurality of noise sources as the noise peak level.

18. The non-transitory computer-readable medium recording the transmission delay analyzing program according to claim 12, wherein
the noise includes crosstalk noise which is given to the signal propagating in the first transmission line, the crosstalk noise being caused by a change in a signal propagating in a second transmission line which is included in the plurality of the transmission lines and is different from the first transmission line.

19. The non-transitory computer-readable medium recording the transmission delay analyzing program according to claim 12, wherein
the noise includes simultaneous switching noise which is given from a power supply to the signal propagating in the first transmission line, the simultaneous switching noise being caused by a simultaneous change of signals propagating in the plurality of transmission lines.

20. A transmission delay analyzing method that analyzes a delay of a signal which is transmitted from a transmitting circuit to a receiving circuit via a predetermined first transmission line included in a plurality of transmission lines connecting the transmitting and receiving circuits, comprising:
acquiring, by using a computer, a noise waveform from among waveforms which propagate in the first transmission line and are acquired by the receiving circuit;
calculating, by using the computer, a noise peak level which is the peak level of the acquired noise waveform;
acquiring, by using the computer, a signal waveform free from noise from among the waveforms which propagate in the first transmission line and are acquired by the receiving circuit; and
calculating, by using the computer, a delay variation of the transmitted signal based on the acquired signal waveform, a threshold for determining the level of a signal that the receiving circuit receives from the first transmission line, and the calculated noise peak level.

* * * * *